(12) United States Patent
Kojima et al.

(10) Patent No.: US 8,928,020 B2
(45) Date of Patent: Jan. 6, 2015

(54) SEMICONDUCTOR LIGHT EMITTING DEVICE

(71) Applicant: Kabushiki Kaisha Toshiba, Minato-ku, Tokyo (JP)

(72) Inventors: Akihiro Kojima, Kanagawa-ken (JP); Yoshiaki Sugizaki, Kanagawa-ken (JP); Hideto Furuyama, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/847,694

(22) Filed: Mar. 20, 2013

(65) Prior Publication Data

US 2014/0203314 A1 Jul. 24, 2014

(30) Foreign Application Priority Data

Jan. 21, 2013 (JP) .................................. 2013-008790

(51) Int. Cl.
H01L 33/50 (2010.01)
H01L 33/00 (2010.01)
H01L 33/22 (2010.01)

(52) U.S. Cl.
CPC ............ *H01L 33/504* (2013.01); *H01L 33/502* (2013.01); *H01L 33/507* (2013.01); *H01L 33/0079* (2013.01); *H01L 33/22* (2013.01)
USPC .......................................................... 257/98

(58) Field of Classification Search
USPC .................... 257/79, 88, 89, 98, 99
See application file for complete search history.

(56) References Cited

U.S. PATENT DOCUMENTS

| 8,110,421 B2 | 2/2012 | Sugizaki et al. |
| 2008/0299398 A1 | 12/2008 | Hata et al. |
| 2010/0142181 A1 | 6/2010 | Schmidt et al. |
| 2010/0148198 A1 | 6/2010 | Sugizaki et al. |
| 2011/0297983 A1 | 12/2011 | Nishiuchi et al. |
| 2013/0075773 A1 | 3/2013 | Kijima et al. |
| 2013/0169149 A1 | 7/2013 | Sato et al. |

FOREIGN PATENT DOCUMENTS

| JP | 2008-258334 A | 10/2008 |
| JP | 2010-219324 A | 9/2010 |

(Continued)

OTHER PUBLICATIONS

EP2610314, translation for WO2012172901.*

(Continued)

*Primary Examiner* — Whitney T Moore
(74) *Attorney, Agent, or Firm* — Holtz, Holtz, Goodman & Chick PC

(57) ABSTRACT

According to one embodiment, a semiconductor light emitting device includes: a semiconductor layer; a p-side electrode; an n-side electrode; and a fluorescent body layer. The p-side electrode is provided on a second surface side of the semiconductor layer. The n-side electrode is provided on the second surface side of the semiconductor layer. The fluorescent body layer is provided on a first surface side of the semiconductor layer and contains a plurality of fluorescent bodies configured to be excited by emission light of the light emitting layer and emit light of a different wavelength from the emission light and a bonding material integrating the plurality of fluorescent bodies and configured to transmit the emission light. An average spacing between adjacent ones of the fluorescent bodies is narrower than a peak wavelength of emission light of the light emitting layer.

20 Claims, 20 Drawing Sheets

(56) References Cited

FOREIGN PATENT DOCUMENTS

| JP | 2011-171585 A | 9/2011 |
|---|---|---|
| WO | WO 2006/121196 A1 | 11/2006 |
| WO | 2008/096301 A1 | 8/2008 |
| WO | WO 2012/029695 A1 | 3/2012 |
| WO | WO 2012/172901 A1 | 12/2012 |

OTHER PUBLICATIONS

Extended European Search Report (EESR) dated Feb. 25, 2014 (in English) in counterpart European Application No. 13160135.3.

European Search Report dated Jan. 7, 2014 (in English) in counterpart European Application No. 13160135.3.

* cited by examiner

SEMICONDUCTOR LIGHT EMITTING DEVICE

CROSS-REFERENCE TO RELATED APPLICATIONS

This application is based upon and claims the benefit of priority from the prior Japanese Patent Application No. 2013-008790, filed on Jan. 21, 2013; the entire contents of which are incorporated herein by reference.

FIELD

Embodiments described herein relate generally to a semiconductor light emitting device.

BACKGROUND

A semiconductor light emitting device that emits visible light such as white light or light in other wavelength ranges by combining a semiconductor light emitting element and a fluorescent body is expanding the use as a small, easy-to-handle light source. However, in such a semiconductor light emitting device, unevenness in light distribution, such as color breakup, may occur and the improvement thereof is required.

DETAILED DESCRIPTION

According to one embodiment, a semiconductor light emitting device includes: a semiconductor layer having a first surface and a second surface on an opposite side to the first surface and including a light emitting layer; a p-side electrode provided on the semiconductor layer on the second surface side; an n-side electrode provided on the semiconductor layer on the second surface side; and a fluorescent body layer provided on the first surface side and containing a plurality of fluorescent bodies configured to be excited by emission light of the light emitting layer and emit light of a different wavelength from the emission light and a bonding material integrating the plurality of fluorescent bodies and configured to transmit the emission light, an average spacing between adjacent ones of the fluorescent bodies being narrower than a peak wavelength of emission light of the light emitting layer.

In general, according to another embodiment, a semiconductor light emitting device includes: a semiconductor layer having a first surface and a second surface on an opposite side to it and including a light emitting layer; a p-side electrode provided on the semiconductor layer on the second surface side; an n-side electrode provided on the semiconductor layer on the second surface side; a sintered fluorescent body provided on the first surface and containing a fluorescent body configured to be excited by emission light of the light emitting layer and emit light of a different wavelength from the emission light; and an intermediate layer provided between the semiconductor layer and the sintered fluorescent body and bonding the sintered fluorescent body to the semiconductor layer.

First Embodiment

Figure 1:
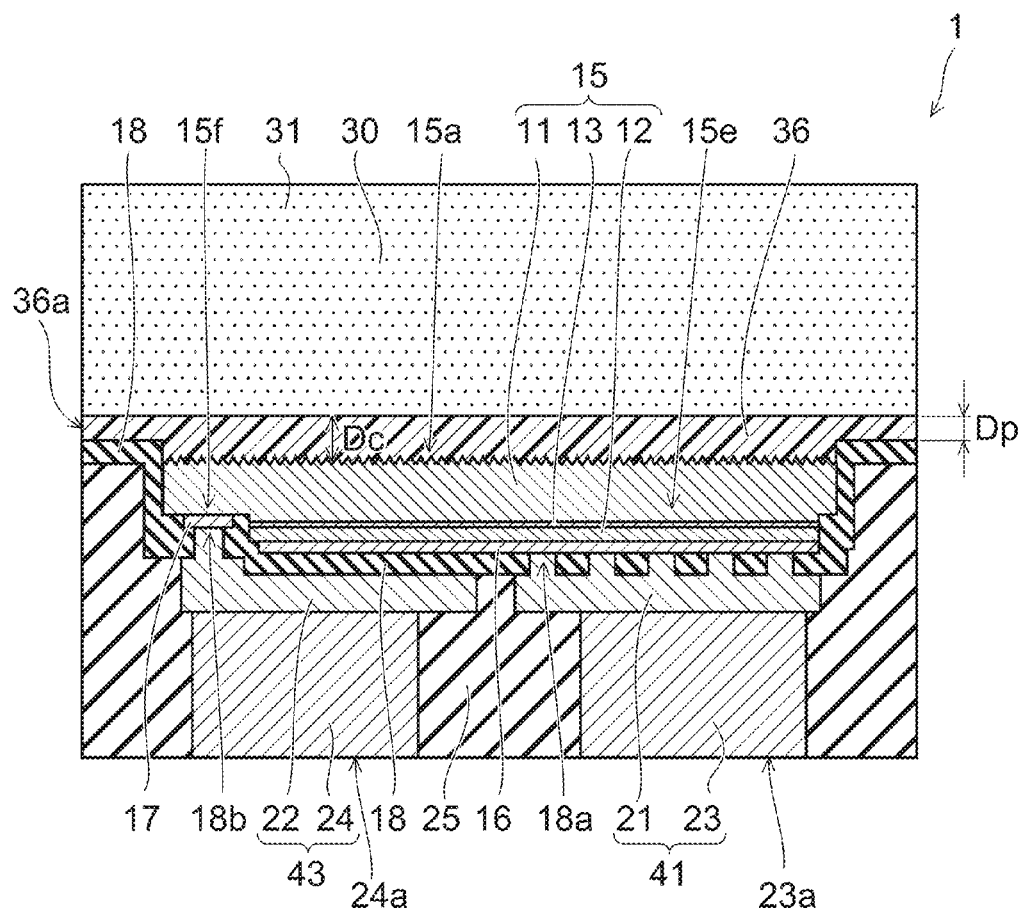
FIG. 1 is a schematic cross-sectional view of a semiconductor light emitting device of a first embodiment.

FIG. 1 is a schematic cross-sectional view of a semiconductor light emitting device 1 of a first embodiment The semiconductor light emitting device 1 includes a semiconductor layer 15 including a light emitting layer 13. The semiconductor layer 15 has a first surface 15a and a second surface 15b on the opposite side to it (see FIG. 7B). The semiconductor layer 15 has a portion 15e including the light emitting layer 13 and a portion 15f not including the light emitting layer 13. The portion 15e including the light emitting layer 13 is a portion of the semiconductor layer 15 where the light emitting layer 13 is stacked. The portion 15f not including the light emitting layer 13 is a portion of the semiconductor layer 15 where the light emitting layer 13 is not stacked.

On the second surface 15b side, a p-side electrode 16 is provided on the portion 15e including the light emitting layer 13, and an n-side electrode 17 is provided on the portion 15f not including the light emitting layer. The light emitting layer 13 emits light by the current flowing between the p-side electrode 16 and the n-side electrode 17. The light emitted from the light emitting layer 13 is emitted to the outside from the first surface 15a.

The semiconductor light emitting device 1 further includes a fluorescent body layer 30. The fluorescent body layer 30 is provided on the first surface 15a of the semiconductor layer 15, and contains a plurality of fluorescent bodies 31. The fluorescent body 31 is excited by the emission light of the light emitting layer 13, and emits light of a different wavelength from the emission light of the light emitting layer 13.

Figure 2:
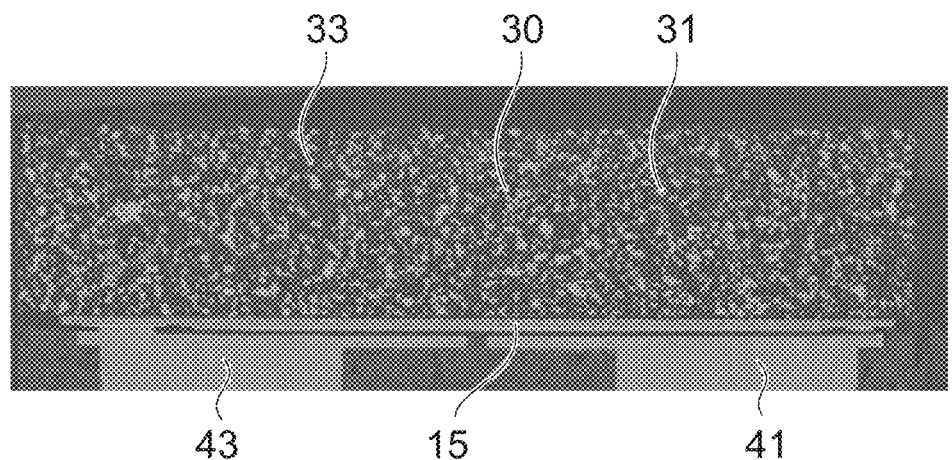
FIG. 2 is a SEM image showing a cross section of the semiconductor light emitting device according to the first embodiment.

The plurality of fluorescent bodies 31 are integrated by a bonding material 33 (see FIG. 2). The average spacing between adjacent fluorescent bodies 31 is narrower than the peak wavelength of the emission light of the light emitting layer 13. The bonding material 33 transmits the emission light of the light emitting layer 13.

Here, "transmit" includes also the case of absorbing part of the light. The structure of the semiconductor light emitting device 1 will now be described in detail with reference to FIG. 1.

The semiconductor layer 15 includes a first semiconductor layer 11, a second semiconductor layer 12, and the light emitting layer 13. The light emitting layer 13 is provided between the first semiconductor layer 11 and the second semiconductor layer 12. The first semiconductor layer 11 and the second semiconductor layer 12 contain, for example, gallium nitride.

The first semiconductor layer 11 includes, for example, an underlying buffer layer and an n-type GaN layer. The second semiconductor layer 12 is, for example, a p-type GaN layer. The light emitting layer 13 contains a material that emits blue light, violet light, bluish violet light, ultraviolet light, etc.

The second surface 15b of the semiconductor layer 15 is fashioned in an uneven form. The convex portion of the unevenness is the portion 15e including the light emitting layer 13, and the concave portion is the portion 15f not including the light emitting layer 13. The second surface of the portion 15e including the light emitting layer 13 is a surface of the second semiconductor layer 12, and the p-side electrode 16 is provided thereon. The second surface of the portion 15f not including the light emitting layer 13 is a surface of the first semiconductor layer 11, and the n-side electrode 17 is provided thereon.

In the second surface 15b of the semiconductor layer 15, for example, the area of the portion 15e including the light emitting layer 13 is provided larger than the area of the portion 15f not including the light emitting layer 13. The area of the p-side electrode 16 provided on the portion 15e including the light emitting layer 13 is larger than the area of the n-side electrode 17 provided on the portion not including the light emitting layer 13. Thereby, a large light emitting surface is obtained, and the light output can be increased.

A first insulating film (hereinafter, an insulating film 18) is provided on the second surface side of the semiconductor layer 15. The insulating film 18 covers the semiconductor layer 15, the p-side electrode 16, and the n-side electrode 17. The insulating film 18 is not provided on the first surface 15a of the semiconductor layer 15.

As the insulating film 18, for example, an inorganic film such as a silicon oxide film and a silicon nitride film is used. Alternatively, a resin such as a polyimide excellent in the patternability of minute openings may be used. In the case where a resin is used as the insulating film 18, for example, an inorganic film such as a silicon oxide film may be provided between the insulating film 18 and the semiconductor layer 15. The inorganic film covers and protects the side surfaces of the light emitting layer 13 and the second semiconductor layer 12.

On a surface of the insulating film 18 on the opposite side to the semiconductor layer 15, a p-side interconnection layer 21 and an n-side interconnection layer 22 are provided away from each other. The insulating film 18 includes a first opening (hereinafter, an opening 18a) leading to the p-side electrode 16 and a second opening (hereinafter, an opening 18b) leading to the n-side electrode 17. Although the insulating film 18 includes a plurality of openings 18a in the example shown in FIG. 1, also a configuration including one opening is possible.

The p-side interconnection layer 21 is provided on the insulating film 18 and also in the opening 18a. That is, the p-side interconnection layer 21 is electrically connected to the p-side electrode 16 via the opening 18a. The n-side interconnection layer 22 is provided on the insulating film 18 and also in the opening 18b, and is electrically connected to the n-side electrode 17.

A p-side metal pillar 23 is provided on a surface of the p-side interconnection layer 21 on the opposite side to the p-side electrode 16. The p-side interconnection unit 41 includes the p-side interconnection layer 21 and the p-side metal pillar 23.

An n-side metal pillar 24 is provided on a surface of the n-side interconnection layer 22 on the opposite side to the n-side electrode 17. The n-side interconnection unit 43 includes the n-side interconnection layer 22 and the n-side metal pillar 24.

A second insulating film (hereinafter, an insulating film 25) is provided between the p-side interconnection unit 41 and the n-side interconnection unit 43. That is, the insulating film 25 is put in between the p-side metal pillar 23 and the n-side metal pillar 24, and covers the insulating film 18, the side surface of the p-side interconnection unit 41, and the side surface of the n-side interconnection unit 43.

As shown in FIG. 1, the insulating film 25 covers the side surface of the p-side metal pillar 23 and the side surface of the n-side metal pillar 24. On the other hand, a surface of the p-side metal pillar 23 on the opposite side to the p-side interconnection layer 21 is exposed from the insulating film 25, and functions as a p-side external terminal 23a. A surface of the n-side metal pillar 24 on the opposite side to the n-side interconnection layer 22 is exposed from the insulating film 25, and functions as an n-side external terminal 24a. The p-side external terminal 23a and the n-side external terminal 24a are bonded to the land pattern of a mounting substrate via, for example, a solder or a conductive bonding material.

Thus, the p-side external terminal 23a and the n-side external terminal 24a are exposed at the same surface (the lower surface in FIG. 1) of the insulating film 25. The spacing between them is preferably set wider than the spacing between the p-side interconnection layer 21 and the n-side interconnection layer 22 on the insulating film 18. That is, the spacing between the p-side external terminal 23a and the n-side external terminal 24a is, for example, set larger than the spread of a solder in the time of mounting. Thereby, a short circuit between the p-side external terminal 23a and the n-side external terminal 24a can be prevented.

In contrast, the spacing between the p-side interconnection layer 21 and the n-side interconnection layer 22 may be set narrow up to the limit in terms of processes. The area of the p-side interconnection layer 21 is expanded, and the contact area between the p-side interconnection layer 21 and the p-side metal pillar 23 is enlarged. Thereby, the heat dissipation of the light emitting layer 13 is promoted.

The area with which the p-side interconnection layer 21 is in contact with the p-side electrode 16 via the plurality of openings 18a is set larger than the area with which the n-side interconnection layer 22 is in contact with the n-side electrode 17 via the opening 18b. Thereby, the distribution of the current flowing through the light emitting layer 13 can be equalized.

The area of the n-side interconnection layer 22 provided on the insulating film 18 may be set larger than the area of the n-side electrode 17. The area of the n-side metal pillar 24 provided on the n-side interconnection layer 22 (that is, the area of the n-side external terminal 24a) may be larger than the n-side electrode 17. Thereby, the area of the n-side electrode 17 can be made small while the area of the n-side external terminal 24a necessary for mounting is kept. For example, the area of the portion 15f not including the light emitting layer 13 of the semiconductor layer 15 is reduced, and the area of the portion 15e including the light emitting layer 13 is expanded; thereby, the light output can be increased.

The first semiconductor layer 11 is electrically connected to the n-side metal pillar 24 via the n-side electrode 17 and the n-side interconnection layer 22. The second semiconductor layer 12 is electrically connected to the p-side metal pillar 23 via the p-side electrode 16 and the p-side interconnection layer 21.

The p-side metal pillar 23 is thicker than the p-side interconnection layer 21, and the n-side metal pillar 24 is thicker than the n-side interconnection layer 22, for example. Each of the thicknesses of the p-side metal pillar 23, the n-side metal pillar 24, and the insulating film 25 may be thicker than the semiconductor layer 15. The "thickness" herein is the width of each layer in the vertical direction in FIG. 2.

Each of the thicknesses of the p-side metal pillar 23 and the n-side metal pillar 24 may be thicker than the thickness of the stacked body including the semiconductor layer 15, the p-side electrode 16, the n-side electrode 17, and the insulating film 18.

The aspect ratio (the ratio of the thickness to the planar size) of the metal pillars 23 and 24 is arbitrary; for example, it may be 1 or more or smaller than 1. That is, the metal pillars 23 and 24 may be either thicker or thinner than the planar size thereof.

By the embodiment, even when a substrate 10 (see FIGS. 8A to 8C) used for forming the semiconductor layer 15 is removed, the semiconductor layer 15 is stably supported by the p-side metal pillar 23, the n-side metal pillar 24, and the insulating film 25. Therefore, the mechanical strength of the semiconductor light emitting element 1 can be kept at a level to withstand the processing after the substrate 10 is removed.

As the material of the p-side interconnection layer 21, the n-side interconnection layer 22, the p-side metal pillar 23, and the n-side metal pillar 24, for example, copper, gold, nickel, silver, and the like may be used. Of these, when copper is used, good thermal conductivity and high migration resistance can be obtained, and the adhesion to insulating materials can be improved.

The insulating film 25 reinforces the p-side metal pillar 23 and the n-side metal pillar 24. For the insulating film 25, a material with a thermal expansion coefficient equal or close to that of the mounting substrate is preferably used. As such a material of the insulating film 25, for example, an epoxy resin, a silicone resin, a fluorine resin, and the like may be given.

In the process of mounting the semiconductor light emitting element 1, the stress due to the member, such as a solder, for connecting the p-side external terminal 23a and the n-side external terminal 24a to the mounting substrate is applied to the semiconductor layer 15, but the p-side metal pillar 23 and the n-side metal pillar 24 absorb and relax the stress.

In the embodiment, the p-side interconnection unit 41 including the p-side interconnection layer 21 and the p-side metal pillar 23 is connected to the p-side electrode 16 via a plurality of vias 21a provided in the plurality of openings 18a away from one another. The stress applied to the semiconductor layer 15 can be more reduced than in the case where, for example, the p-side interconnection unit 41 is connected to the p-side electrode 16 via one via having an area equal to the total of the contact areas of the vias 21a.

On the other hand, the p-side interconnection layer 21 may be connected to the p-side electrode 16 via a post with a larger planar size than the via 21a provided in one large opening.

Thereby, heat radiation via the p-side electrode 16, the p-side interconnection layer 21, and the p-side metal pillar 23 can be improved.

As described later, the substrate 10 used for the formation of the semiconductor layer 15 is removed from the semiconductor layer 15. Thereby, the height of the semiconductor light emitting element 1 is reduced. Fine unevenness is formed on the first surface 15a of the semiconductor layer 15 from which the substrate 10 has been removed. For example, wet etching using an alkali-based solution (frost treatment) is performed on the first surface 15a to form unevenness. Thereby, the emission light of the light emitting layer 13 can be extracted to the outside from the first surface 15a without being totally reflected.

The semiconductor light emitting device 1 further includes an intermediate layer 36 provided between the fluorescent body layer 30 and the semiconductor layer 15. The intermediate layer 36 contains, for example, a silicone resin or an epoxy resin, and transmits the emission light of the light emitting layer 13.

The intermediate layer 36 is provided such that, for example, the thickness Dc of the portion provided on the central portion of the semiconductor layer 15 is thicker than the thickness Dp of the portion provided along the outer periphery of the semiconductor layer 15. The thickness Dp of the portion provided along the outer periphery of the semiconductor layer 15 is preferably half or less of the spacing between the outer edge of the semiconductor layer 15 and the outer edge of the fluorescent body layer 30. The refractive index of the fluorescent body layer 30 is set larger than the refractive index of the intermediate layer 36. Thereby, the light propagated through the intermediate layer 36 and emitted to the outside from the side surface 36a thereof can be suppressed.

Next, characteristics of the semiconductor light emitting device 1 according to the embodiment are described with reference to FIG. 2 to FIG. 5B.

FIG. 2 is a SEM image showing a cross section of the semiconductor light emitting device 1 according to the first embodiment.

As shown in FIG. 2, the semiconductor light emitting device 1 includes the fluorescent body layer 30 provided on the first surface 15a side of the semiconductor layer 15. The fluorescent body layer 30 contains fluorescent bodies 31 and the bonding material 33.

The fluorescent body 31 contains, for example, at least one of a yellow fluorescent substance, a red fluorescent substance, and a green fluorescent substance that are excited by the emission light of the light emitting layer 13. The fluorescent body 31 may be a ceramic-based fine particle.

For the bonding material 33, for example, a silicone resin or silica may be used. The refractive index of the bonding material 33 is preferably larger than the refractive index of the intermediate layer 36. For example, the bonding material 33 contains high refractive index particles. The refractive index of the bonding material 33 is larger than, for example, 1.5.

If the amount of fluorescent bodies 31 contained in the fluorescent body layer 30 is reduced, the average spacing between fluorescent bodies is widened, for example. The excitation light emitted from the light emitting layer 13 is propagated for a long distance while being scattered by fluorescent bodies 31. Therefore, the proportion of excitation light included in the light emitted to the lateral side of the fluorescent body layer 30 (in a direction parallel to the first surface 15a of the semiconductor layer 15) is increased.

Figure 3:
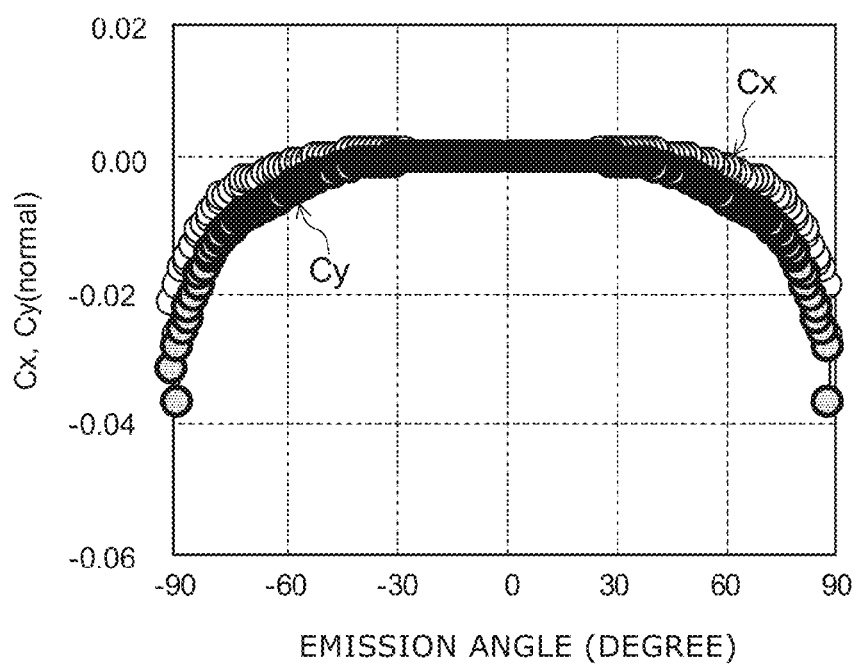
FIG. 3 is a graph showing a light distribution characteristics of a semiconductor light emitting device according to a comparative example.

FIG. 3 is a graph showing the light distribution characteristics of a semiconductor light emitting device according to a comparative example. The vertical axis is the chromaticity coordinates Cx and Cy, and the horizontal axis is the emission angle (the angle from the center of the chip).

In the fluorescent body layer of the semiconductor light emitting device according to the comparative example, the amount of fluorescent bodies 31 contained is small, and the average spacing between fluorescent bodies is wide. Therefore, as shown in FIG. 3, as the absolute value of the emission angle increases, the values of the chromaticity coordinates Cx and Cy of emission light decrease. That is, this shows a tendency of an increase in the ratio of the blue excitation light emitted from the light emitting layer 13.

Figure 4A:
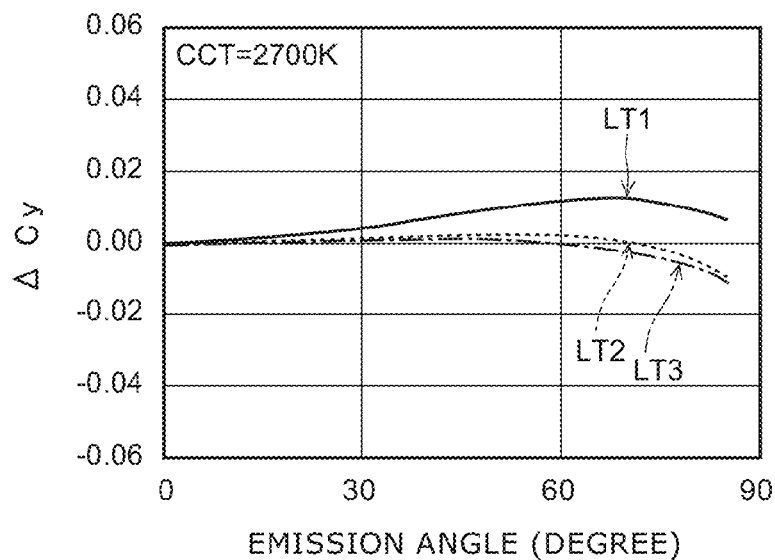
FIG. 4A and FIG. 4B are graphs showing characteristics of the semiconductor light emitting device according to the embodiment.
Figure 4B:
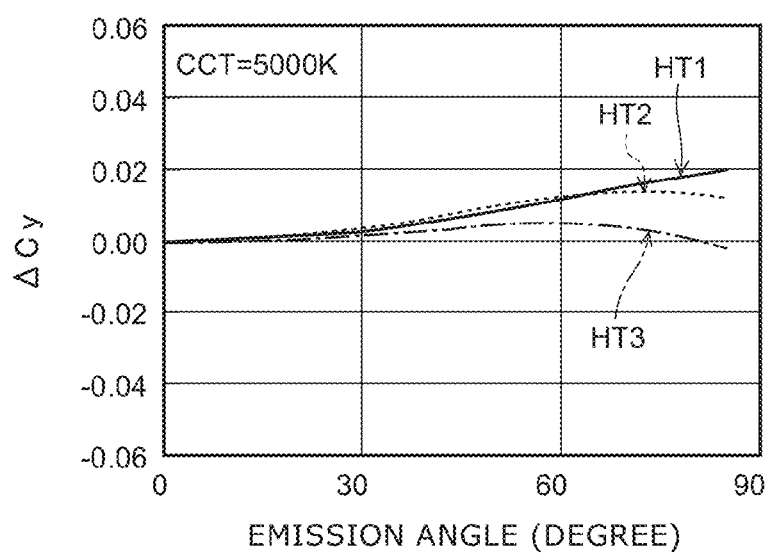

FIG. 4A and FIG. 4B are graphs showing characteristics of the semiconductor light emitting device according to the embodiment. The vertical axis is the shift amount $\Delta Cy$ of the chromaticity coordinate Cy, and the horizontal axis is the emission angle (the angle from the center of the chip). $\Delta Cy$ shows the amount of change when the emission angle is changed, taking the chromaticity coordinate when the emission angle is 0 degrees as a reference.

FIG. 4A shows the relationship between $\Delta Cy$ in the case where the correlated color temperature (CCT) of the luminous color of the semiconductor light emitting device is 2700 kelvin (K) and the emission angle. The three graphs shown in the drawing show characteristics of samples LT1, LT2, and LT3, respectively. The fluorescent body layer of sample LT1 contains 45 weight percent (wt %) fluorescent bodies, the fluorescent body layer of sample LT2 contains 50 wt % fluorescent bodies, and the fluorescent body layer of sample LT3 contains 54 wt % fluorescent bodies.

FIG. 4B shows the relationship between $\Delta Cy$ in the case where the CCT is 5000 K and the emission angle. The three graphs shown in the drawing show characteristics of samples HT1, HT2, and HT3, respectively. The fluorescent body layer of sample HT1 contains 40 wt % fluorescent bodies, the fluorescent body layer of sample HT2 contains 45 wt % fluorescent bodies, and the fluorescent body layer of sample HT3 contains 50 wt % fluorescent bodies.

As shown in FIG. 4A and FIG. 4B, as the emission angle increases, also $\Delta Cy$ increases. As the amount of fluorescent bodies contained in the fluorescent body layer increases, the shift amount $\Delta Cy$ of color temperature decreases.

Figure 5A:
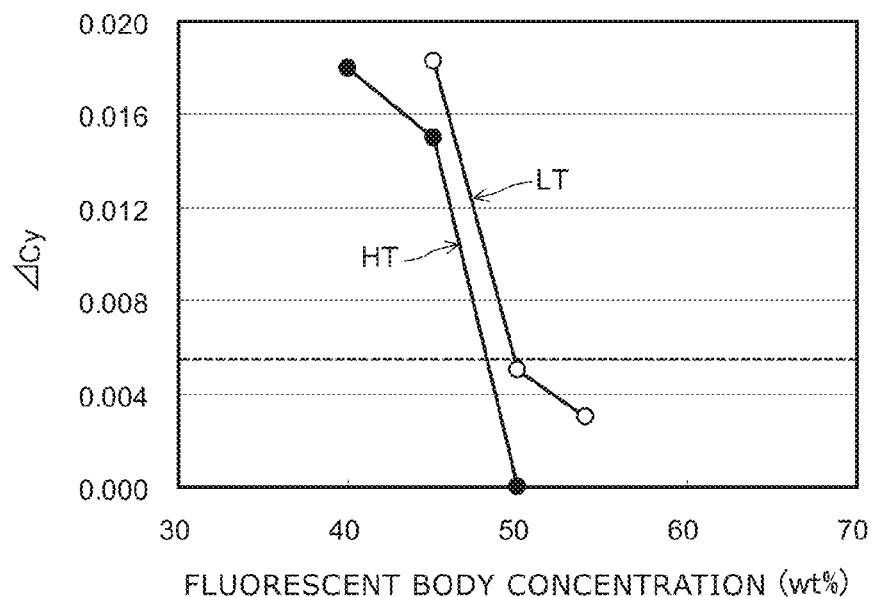
FIG. 5A and FIG. 5B are graphs showing other characteristics of the semiconductor light emitting device according to the embodiment.
Figure 5B:
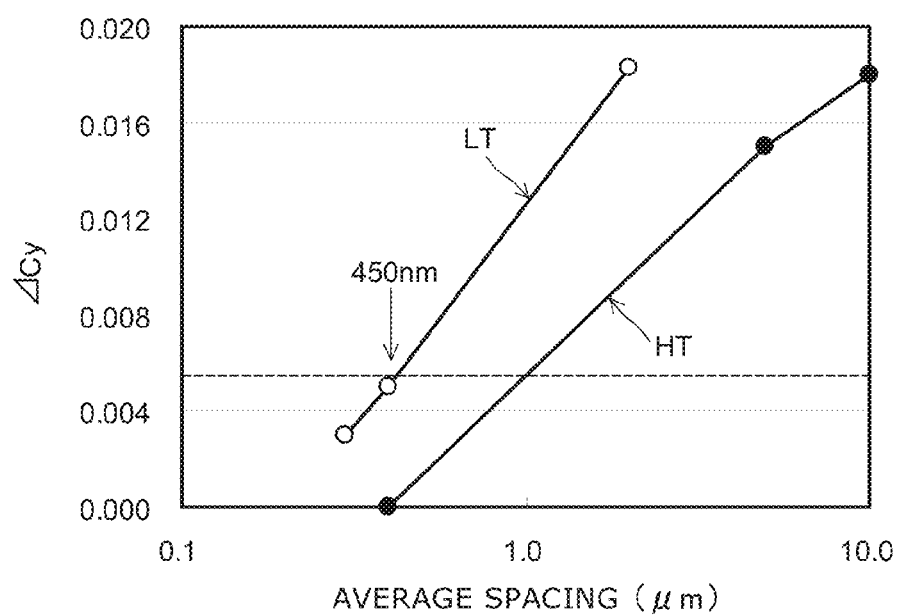

FIG. 5A and FIG. 5B are graphs showing other characteristics of the semiconductor light emitting device according to the embodiment. The vertical axis is the shift amount $\Delta Cy$ of the color coordinate Cy at an emission angle of 80 degrees. The horizontal axis of FIG. 5A is the concentration of fluorescent bodies contained in the fluorescent body layer, and the horizontal axis of FIG. 5B is the average spacing between adjacent fluorescent bodies in the fluorescent body layer.

As shown in FIG. 5A, when the fluorescent body concentration is increased, $\Delta Cy$ decreases. For example, it is found that, to make $\Delta Cy$ 0.005 or less, the fluorescent body concentration may be set to 48 wt % or more in sample HT in which CCT=5000 K, and may be set to approximately 50 wt % or more in the sample in which CCT=2700 K.

FIG. 5B shows that $\Delta Cy$ decreases as the average spacing between fluorescent bodies becomes narrower. For example, it is found that, to make $\Delta Cy$ 0.005 or less, the average spacing may be set to approximately 1 µm or less in sample HT, and may be set to 400 nm or less in sample LT.

In the samples shown in FIG. 5B, the light emitting layer contains a GaN-based semiconductor material, and the peak wavelength of the emission light thereof is approximately 450 nm. Therefore, as shown in FIG. 5B, $\Delta Cy$ can be made 0.005 or less by setting the average spacing between fluorescent bodies narrower than the peak wavelength 450 nm of the emission light of the light emitting layer. Also the shift amount $\Delta Cx$ of Cx exhibits the same tendency.

There is, for example, a MacAdam ellipse used as a chromaticity control standard. According to the control standard based on the MacAdam ellipse, when $\Delta C<0.005$, it is difficult for a human eye to recognize a difference in color. That is, $\Delta C$ can be made 0.005 or less by setting the average spacing between fluorescent bodies contained in the fluorescent body layer narrower than the peak wavelength of the emission light of the light emitting layer. The decrease in Cx and Cy in a region where the absolute value of the emission angle is large can be suppressed, and the uniformity in the luminous color of the semiconductor light emitting device can be improved.

Figure 6:
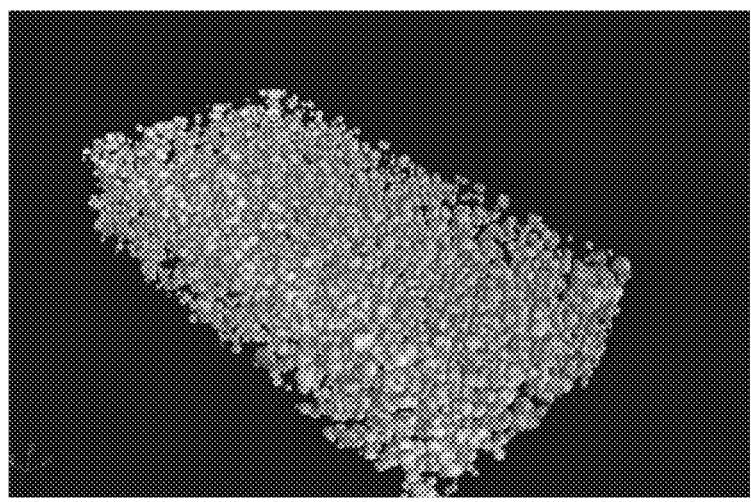
FIG. 6 shows an image of a semiconductor light emitting device according to the embodiment measured using X-ray CT.

FIG. 6 shows an image of a semiconductor light emitting device according to the embodiment measured using X-ray CT. In the sample shown in FIG. 6, the concentration of fluorescent bodies contained in the fluorescent body layer is 54 wt %.

As shown in FIG. 6, the CT image can show the structure of the fluorescent body layer three-dimensionally, and clearly shows the fluorescent particles contained in it. Thus, the average spacing between fluorescent bodies contained in the fluorescent body layer can be measured using X-ray CT. That is, the average spacing can be found by three-dimensionally measuring the position of the fluorescent body by CT scanning and statistically processing the measurement data.

Next, a method for manufacturing the semiconductor light emitting device 1 according to the embodiment is described with reference to FIG. 7A to FIG. 15B. FIG. 7A to FIG. 15B are schematic views showing the manufacturing processes of the semiconductor light emitting device 1 according to the embodiment.

Figure 7A:
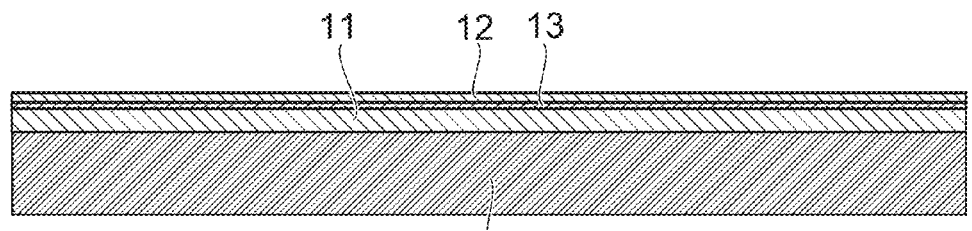
FIGS. 7A to 15B are schematic views showing a manufacturing process of the semiconductor light emitting device according to the first embodiment.

FIG. 7A is a cross-sectional view showing the first semiconductor layer 11, the second semiconductor layer 12, and the light emitting layer 13 formed on the major surface of the substrate 10. For example, the MOCVD (metal organic chemical vapor deposition) method is used to sequentially grow the first semiconductor layer 11, the light emitting layer 13, and the second semiconductor layer 12 on the substrate 10. The substrate is, for example, a silicon substrate. Also a sapphire substrate may be used as the substrate 10. The first semiconductor layer 11, the light emitting layer 13, and the second semiconductor layer 12 are, for example, a nitride semiconductor and contains gallium nitride (GaN).

The first semiconductor layer 11 is, for example, an n-type GaN layer. The first semiconductor layer 11 may have a stacked structure including a buffer layer provided on the substrate 10 and an n-type GaN layer provided on the buffer layer. The second semiconductor layer 12 includes, for example, a p-type AlGaN layer provided on the light emitting layer 13 and a p-type GaN layer provided on the p-type AlGaN layer.

Figure 7B:
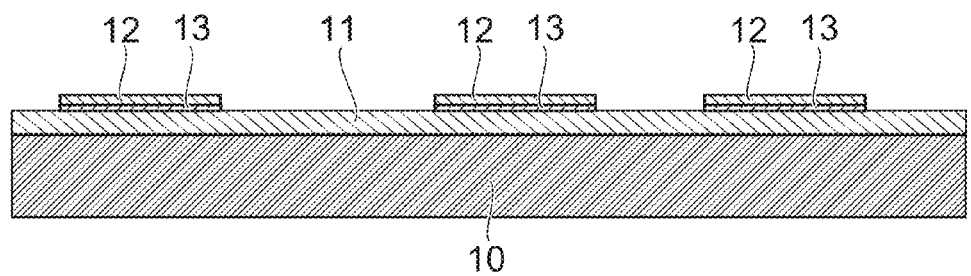
Figure 7C:
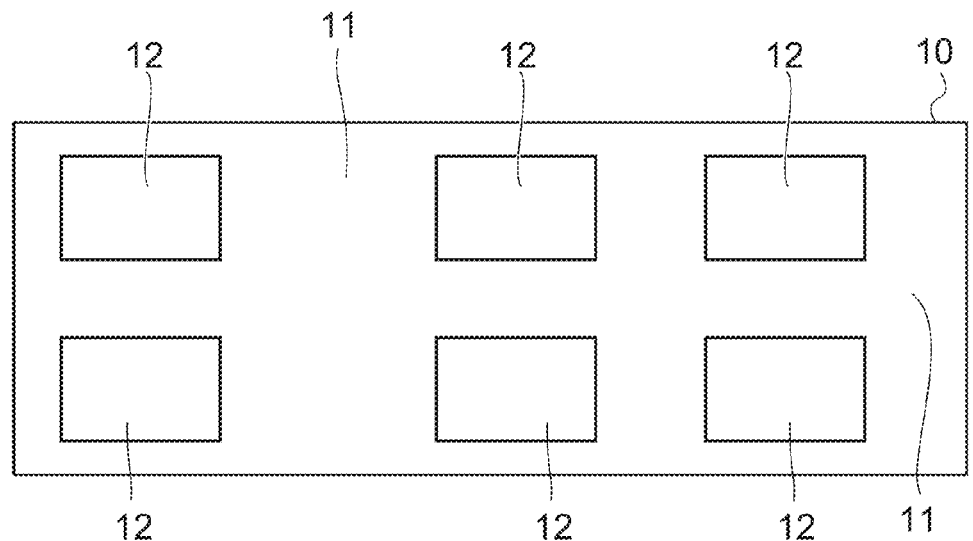

FIG. 7B and FIG. 7C show a state where the second semiconductor layer 12 and the light emitting layer 13 are selectively removed. FIG. 7B is a cross-sectional view, and FIG. 7C is a plan view showing the upper surface side of the substrate 10.

As shown in FIG. 7B, for example, the RIE (reactive ion etching) method is used to selectively etch the second semiconductor layer 12 and the light emitting layer 13 to expose the first semiconductor layer 11.

As shown in FIG. 7C, the semiconductor layer 12 and the light emitting layer 13 are patterned into an island configuration, and a plurality of light emitting regions (portions 15e including the light emitting layer 13) are formed on the substrate 10.

Figure 8A:
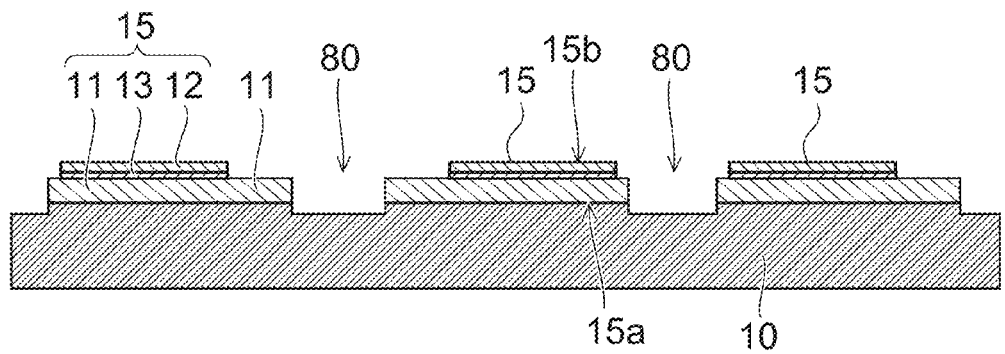
Figure 8B:
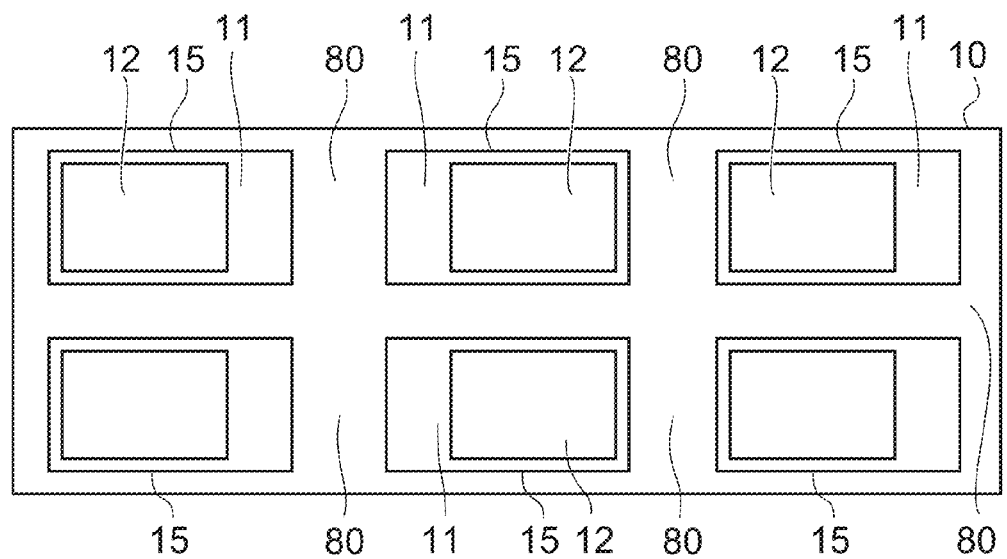

Next, as shown in FIG. 8A and FIG. 8B, the first semiconductor layer 11 is selectively removed to form a plurality of semiconductor layers 15 on the substrate 10.

FIG. 8A shows a cross section of the substrate 10 and the semiconductor layer 15 formed thereon. For example, an etching mask (not shown) covering the second semiconductor layer 12 and the light emitting layer 13 is provided on the first semiconductor layer 11. Subsequently, the RIE method is used to etch the first semiconductor layer 11 to form a trench 80 with a depth reaching the substrate 10.

FIG. 8B shows the upper surface of the substrate 10 provided with the semiconductor layer 15. The trench 80 is provided in a lattice configuration on the substrate 10, and separates the first semiconductor layer 11 to form a plurality of semiconductor layers 15.

The first surface 15a of the semiconductor layer 15 is a surface in contact with the substrate 10, and the second surface 15b is surfaces of the first semiconductor layer 11 and the second semiconductor layer 12. The trench 80 is formed by etching the upper surface of the substrate 10, and is provided in a position deeper than the first surface 15a.

Figure 9A:
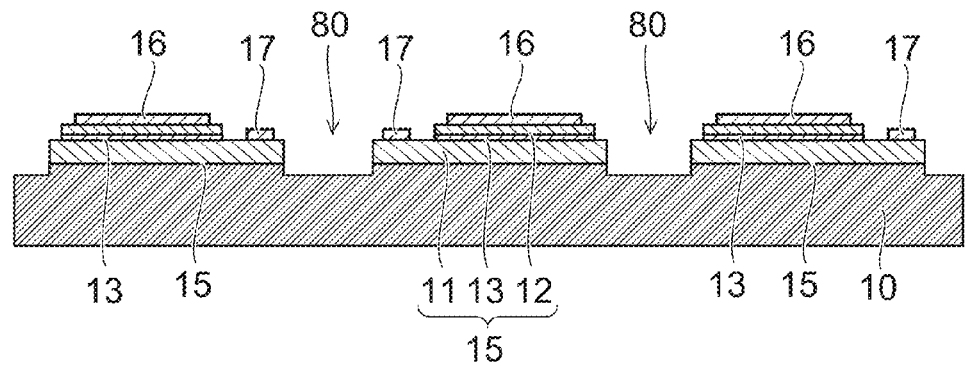
Figure 9B:
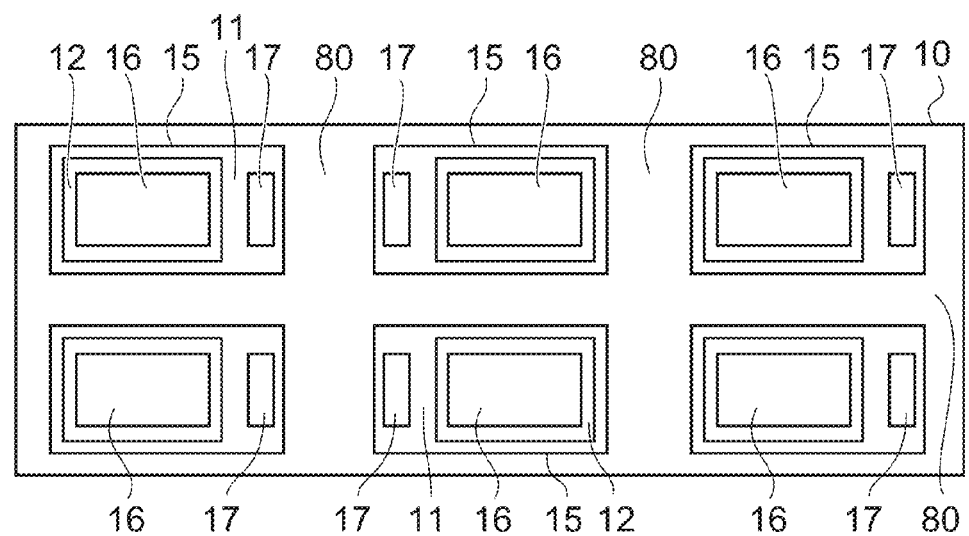

The trench 80 may be formed after the p-side electrode 16 and the n-side electrode 17 are formed (see FIGS. 9A and 9B).

Next, as shown in FIG. 9A and FIG. 9B, the p-side electrode 16 and the n-side electrode 17 are formed on the second surface 15b of the semiconductor layer 15. FIG. 9A is a cross-sectional view, and FIG. 9B is a plan view showing the upper surface of the substrate 10.

The p-side electrode 16 is formed on the second semiconductor layer 12. The n-side electrode 17 is formed on the first semiconductor layer 11. The p-side electrode 16 has a larger area than the n-side electrode.

The p-side electrode 16 and the n-side electrode 17 are formed by, for example, the sputtering method, the vapor deposition method, or the like. Either the p-side electrode 16 or the n-side electrode 17 may be formed earlier, or both may be formed simultaneously using the same material. The p-side electrode 16 is formed so as to reflect the emission light of the light emitting layer 13. The p-side electrode 16 contains, for example, silver, a silver alloy, aluminum, an aluminum alloy, or the like. To prevent the sulfuration and oxidation of the p-side electrode 16, a configuration including a metal protection film (barrier metal) may be used. To form an ohmic contact between each electrode and the semiconductor layer, heat treatment is performed as necessary.

Figure 10A:
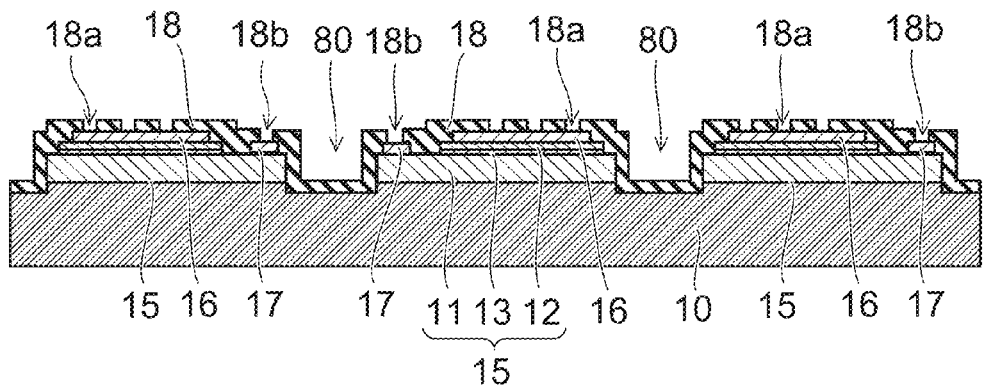

Next, as shown in FIG. 10A, the insulating film 18 is formed on the upper surface of the substrate 10. FIG. 10A is a schematic view showing a cross section of the substrate 10 and the semiconductor layer 15.

The insulating film 18 covers the structure provided on the substrate 10, and has the first opening (hereinafter, the opening 18a) and the second opening (hereinafter, the opening 18b).

The insulating film 18 is, for example, a silicon oxide film or a silicon nitride film, and may be formed using the CVD (chemical vapor deposition) method. The openings 18a and 18b are formed by, for example, wet etching using a resist mask. The opening 18a leads to the p-side electrode 16. The opening 18b leads to the n-side electrode 17. In the embodiment, the insulating film 18 includes a plurality of openings 18a and one opening 18b.

Also an organic film of a polyimide or the like, for example, may be used as the insulating film 18. When an organic film of a photosensitive polyimide, benzocyclobutene, or the like is used for the insulating film 18, direct exposure and development can be performed. Therefore, the patterning of the openings 18a and 18b is easy.

Next, FIG. 10B to FIG. 11B show the formation processes of the p-side interconnection layer 21 and the n-side interconnection layer 22. FIG. 10B to FIG. 11A are schematic views showing a cross section of the substrate 10 and the semiconductor layer 15, and FIG. 11A is a plan view showing the upper surface of the substrate 10.

Figure 10B:
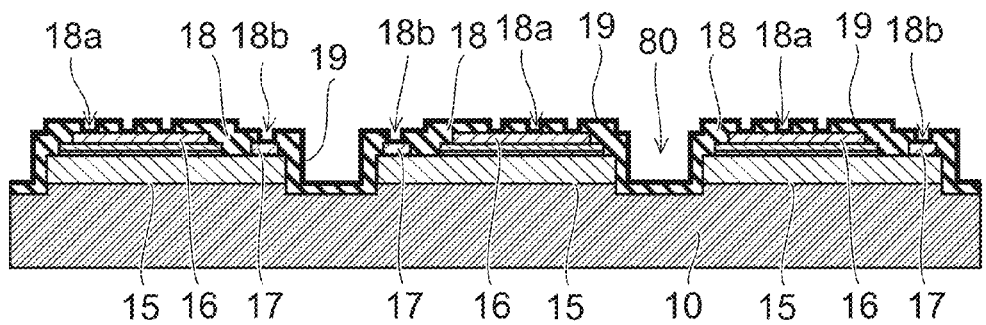

As shown in FIG. 10B, a metal film 19 is formed on the surface of the insulating film 18, the inner surface (side wall and bottom surface) of the first opening 18a, and the inner surface (side wall and bottom surface) of the second opening 18b. The metal film 19 functions as a seed metal in the plating process.

The metal film 19 is, for example, formed using the sputtering method so as to contain titanium (Ti) and copper (Cu) in this order from the insulating film 18 side. Aluminum may be used in place of titanium.

Figure 10C:
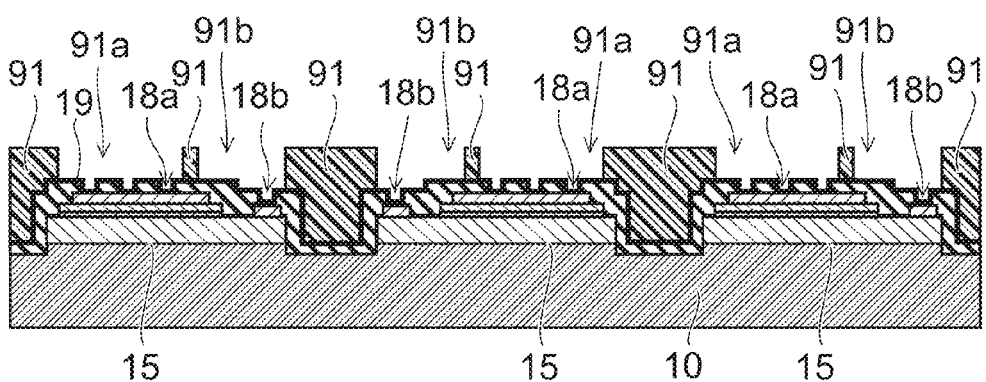

Next, as shown in FIG. 10C, a resist mask 91 is formed on the metal film 19. The resist mask 91 includes an opening 91a and an opening 91b. The opening 91a is provided on the p-side electrode 16, and the opening 91b is provided on the n-side electrode 17.

Figure 11A:
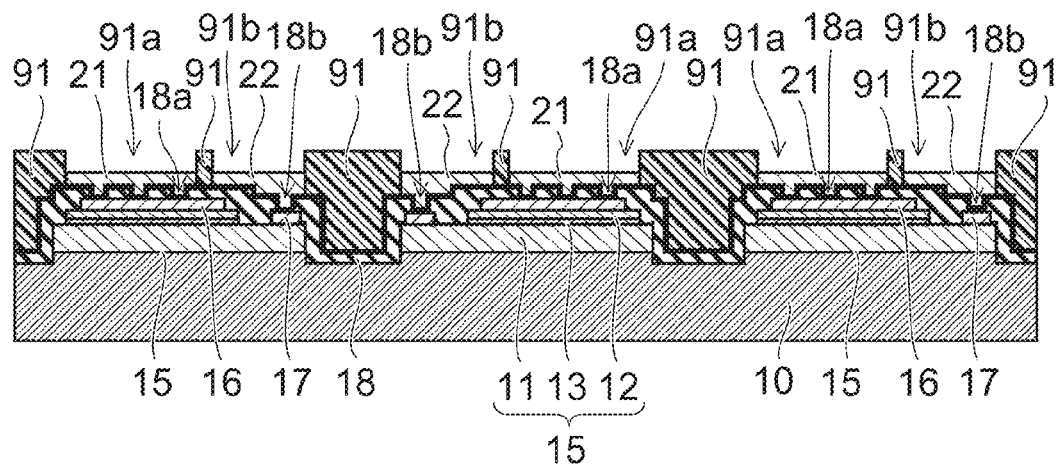
Figure 11B:
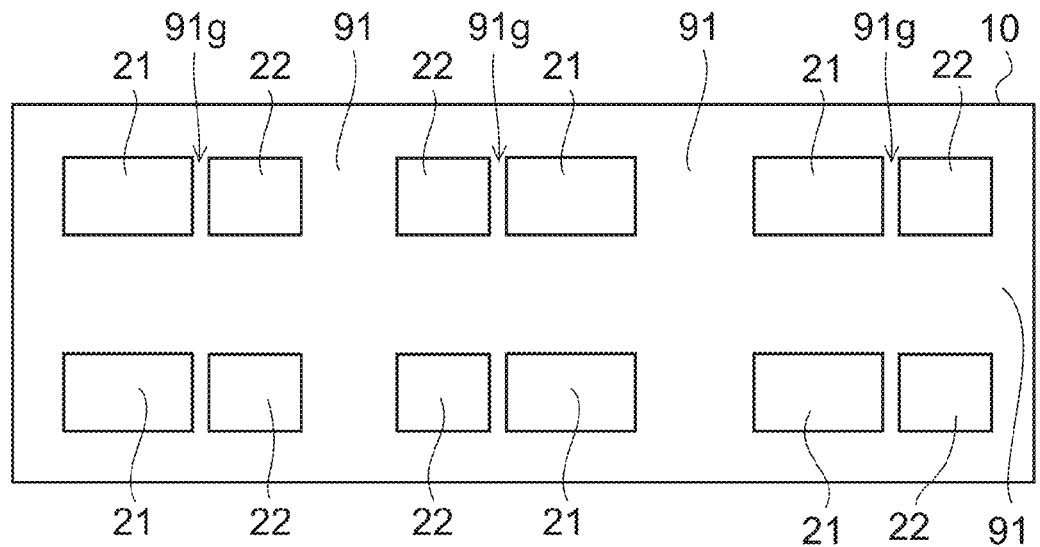

Subsequently, as shown in FIG. 11A and FIG. 11B, the p-side interconnection layer 21 and the n-side interconnection layer 22 are formed using electrolytic copper plating. That is, using the metal film 19 as a current path, a copper (Cu) layer is selectively formed in the openings 91a and 91b of the resist mask 91.

As shown in FIG. 11A, the p-side interconnection layer 21 is formed on the insulating film 18 and also in the opening 18a. The p-side interconnection layer 21 is electrically connected to the p-side electrode 16. The n-side interconnection layer 22 is formed on the insulating film 18 and also in the opening 18b. The n-side interconnection layer 22 is electrically connected to the n-side electrode 17.

As shown in FIG. 11B, the p-side interconnection layer 21 and the n-side interconnection layer 22 face each other across a resist mask 91g. That is, the spacing between the p-side interconnection layer 21 and the n-side interconnection layer 22 may be provided narrow up to the limit of photolithography.

Figure 12A:
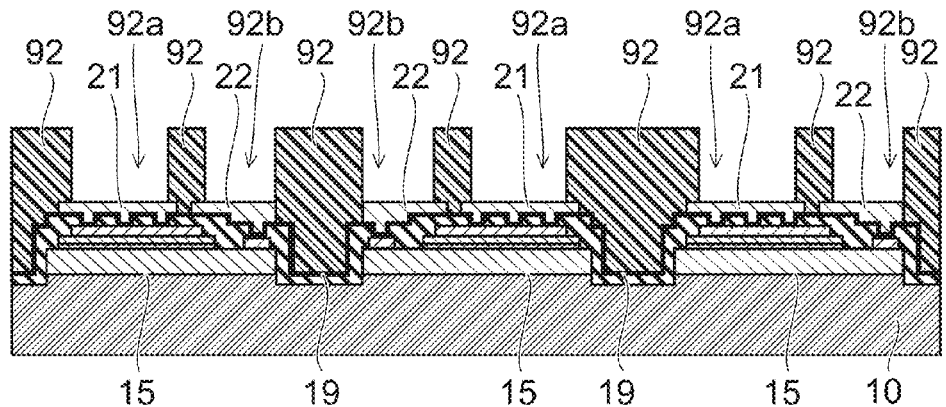
Figure 12B:
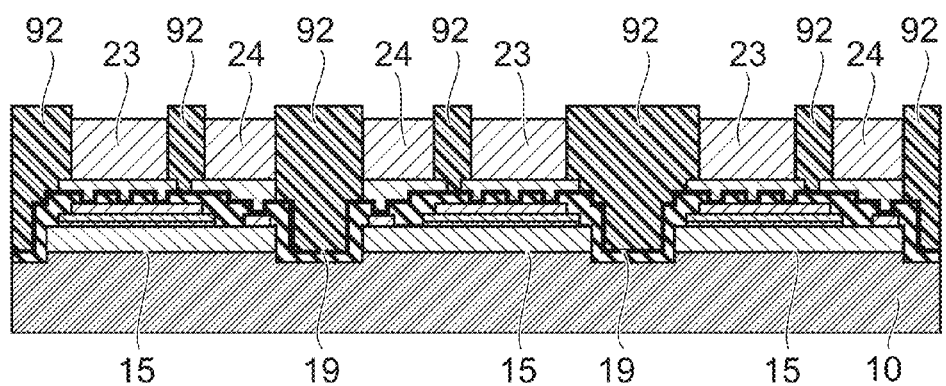
Figure 12C:
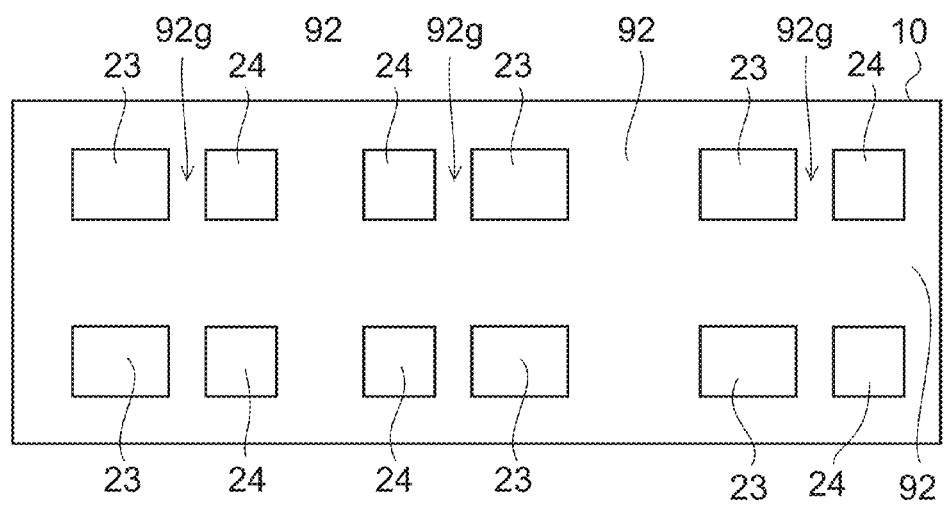

Next, FIG. 12A to FIG. 12C show the formation processes of the p-side interconnection layer 21 and the n-side interconnection layer 22. FIG. 12A and FIG. 12B are schematic views showing a cross section of the substrate 10 and the semiconductor layer 15, and FIG. 12C is a plan view showing the upper surface of the substrate 10.

As shown in FIG. 12A, a resist mask 92 having an opening 92a and an opening 92b is formed. For example, after the resist mask 91 is removed using a solvent or oxygen plasma, photolithography is used to newly form the resist mask 92. The resist mask 92 may be formed also by stacking it on the resist mask 91.

Subsequently, as shown in FIG. 12B, the p-side metal pillar 23 and the n-side metal pillar 24 are formed in the openings 92a and 92b, respectively. The p-side metal pillar 23 and the n-side metal pillar 24 are formed using, for example, electrolytic Cu plating.

As shown in FIG. 12C, the p-side metal pillar 23 and the n-side metal pillar 24 face each other across a resist mask 92g. The spacing between the p-side metal pillar 23 and the n-side metal pillar 24 is formed wider than the spacing between the p-side interconnection layer 21 and the n-side interconnection layer 22 in order to prevent a short circuit during mounting.

Figure 13A:
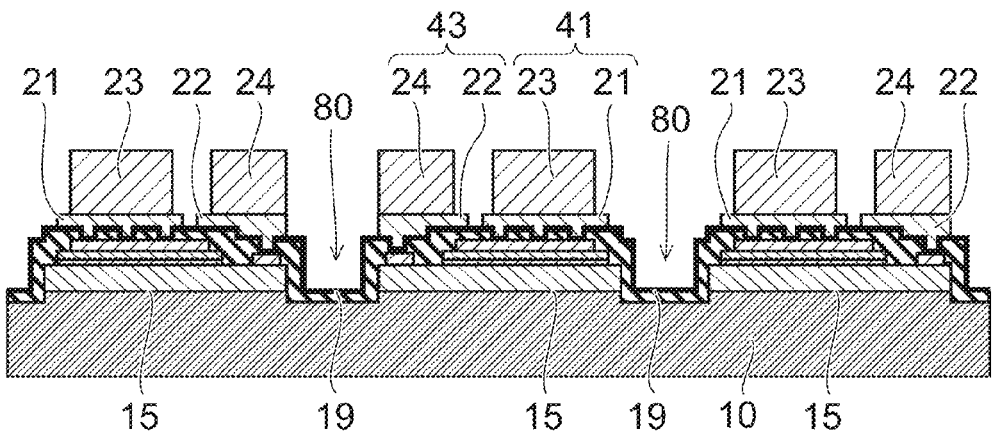
Figure 13B:
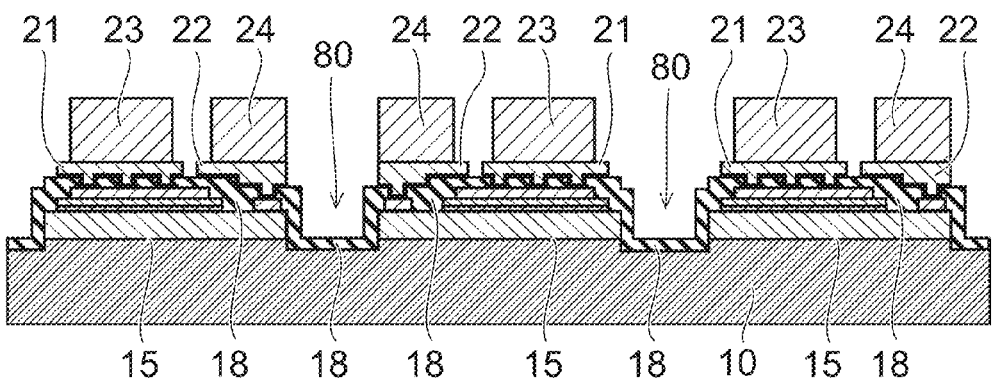
Figure 13C:
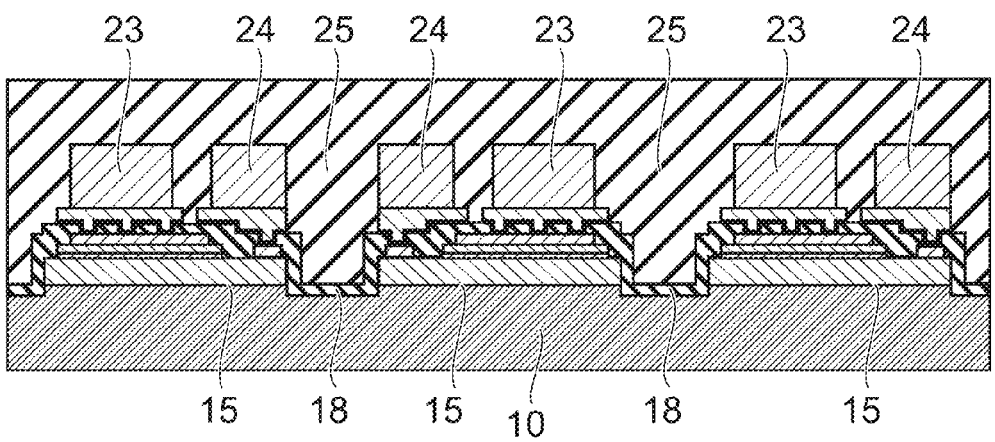

FIG. 13A to FIG. 13C are schematic cross-sectional views showing processes continuing from FIG. 12C. As shown in FIG. 13A, the resist mask 92 is removed using, for example, a solvent or oxygen plasma. Subsequently, as shown in FIG. 13B, the exposed portion of the metal film 19 is removed by wet etching using the metal pillar 23, the n-side metal pillar 24, the p-side interconnection layer 21, and the n-side interconnection layer 22 as a mask. Thereby, the electrical connection between the p-side interconnection layer 21 and the n-side interconnection layer 22 is cut off.

Next, as shown in FIG. 13C, the second insulating film (hereinafter, the insulating film 25) is stacked on the insulating film 18. The insulating film 25 covers the p-side interconnection layer 21, the n-side interconnection layer 22, the p-side metal pillar 23, and the n-side metal pillar 24.

The insulating film 25 insulates the n-side interconnection unit 43 from the p-side interconnection unit 41. The insulating film 25 contains, for example, carbon black, and blocks the emission light of the light emitting layer 13. The insulating film 25 may contain, for example, a material that reflects the emission light of the light emitting layer 13, such as titanium oxide.

Figure 14A:
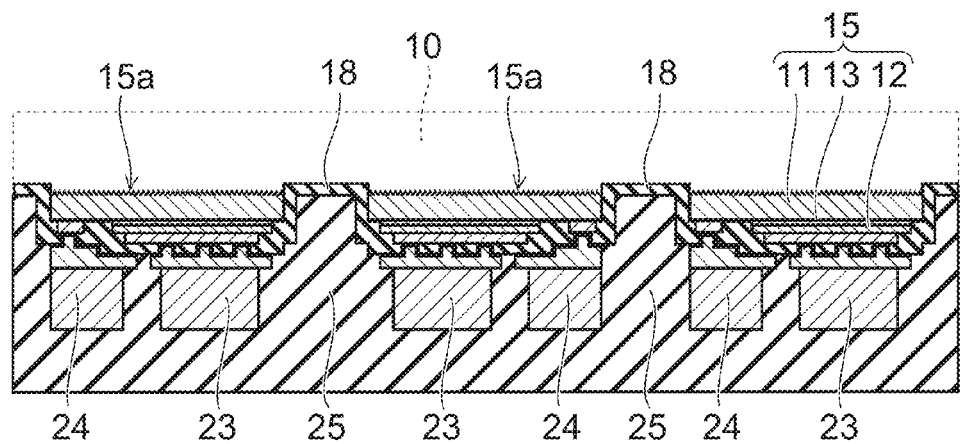
Figure 14B:
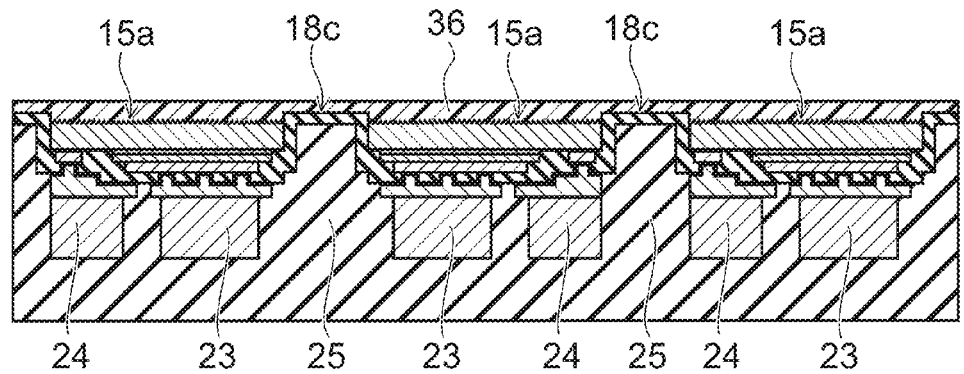
Figure 14C:
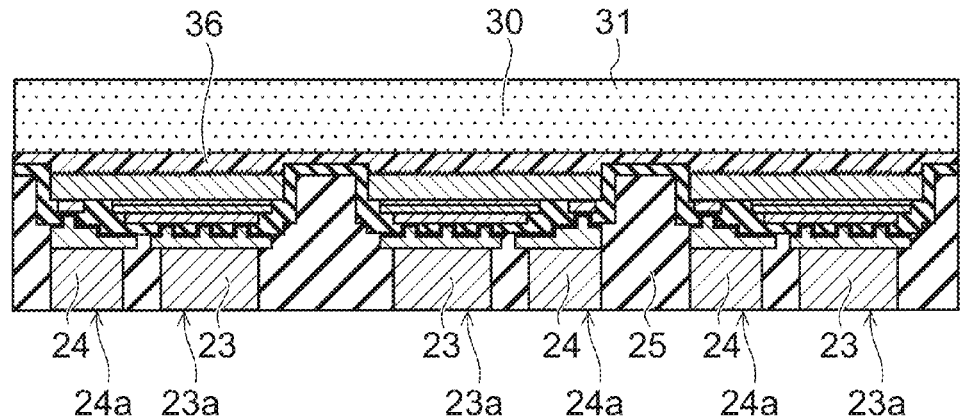

Next, as shown in FIG. 14A to FIG. 14C, the processing of the first surface 15a side of the semiconductor layer 15 is performed. FIG. 14A to FIG. 14C are schematic cross-sectional views showing the processes.

As shown in FIG. 14A, the substrate 10 is removed from the semiconductor layer 15. In the case where the substrate 10 is a silicon substrate, for example, the substrate 10 can be selectively removed by wet etching. In the case where the substrate 10 is a sapphire substrate, for example, the substrate 10 is removed using the laser lift-off method.

The structure formed on the substrate 10 is still supported by the insulating film 25 after the substrate 10 is removed, and keeps the wafer state. The semiconductor layer 15 is supported by the p-side metal pillar 23, the n-side metal pillar 24, and the insulating film 25. These are materials more flexible than the semiconductor layer 15, and relax the stress of the semiconductor layer 15. For example, a semiconductor layer epitaxially grown on the substrate 10 includes a large internal stress. Even when the stress is released at once during the peeling of the substrate 10, the p-side metal pillar 23, the n-side metal pillar 24, and the insulating film 25 absorb the stress. Therefore, damage to the semiconductor layer 15 in the process of removing the substrate 10 can be avoided.

Next, fine unevenness is formed on the first surface 15a of the semiconductor layer 15. For example, the first semiconductor layer 11 is wet-etched with a KOH (potassium hydroxide) aqueous solution, TMAH (tetramethylammonium hydroxide), or the like. In this etching, a difference in the etching rate depending on the crystal plane direction occurs. Consequently, as shown in FIG. 14A, unevenness can be formed on the first surface 15a. It is also possible to form a resist mask on the first surface 15a to selectively etch the surface of the first semiconductor layer 11. Thus, by forming unevenness on the first surface 15a, the extraction efficiency of the emission light of the light emitting layer 13 can be improved.

Next, as shown in FIG. 14B, an insulating layer 36 is formed on the first surface 15a. The insulating layer 36 contains, for example, a silicone resin or an epoxy resin, and covers the unevenness provided on the first surface 15a.

The insulating film 18 between adjacent semiconductor layers 15 is the portion formed on the bottom surface of the trench 80. Therefore, the upper surface 18c of the insulating film 18 in FIG. 14B protrudes above the first surface 15a. Thus, in the insulating layer 36, the portion provided on the insulating film 18 is thinner than the portion provided on the first surface 15a.

Next, as shown in FIG. 14C, the fluorescent body layer 30 is formed on the intermediate layer 36. The fluorescent body layer 30 contains fluorescent bodies 31 and the bonding material 33 (see FIG. 2), and is formed using, for example, a method such as printing, potting, molding, and compression molding.

A sintered fluorescent body formed by sintering fluorescent bodies 31 via the bonding material 33 may be attached as the fluorescent body layer 30. For example, an adhesive containing an epoxy resin or the like is applied to the first surface 15a, and a plate containing sintered fluorescent bodies 31 is pressure-bonded. Thereby, the fluorescent body layer 30 is attached to the first surface 15a via a bonding layer. In this case, the intermediate layer 36 is the bonding layer in which the adhesive is cured, and bonds the fluorescent body layer 30 to the semiconductor layer 15 and the insulating film 18.

The fluorescent body 31 is, for example, a yellow fluorescent substance that emits yellow light, a red fluorescent substance that emits red light, a green fluorescent substance that emits green light, or a mixture of them. A ceramic-based fine particle, for example, may be used for the fluorescent body 31. For the bonding material 33, for example, a silicone resin, an acrylic resin, or a phenyl resin is used. The bonding material 33 may contain, for example, a filler such as silica. Also a glass material containing silica may be used as the bonding material 33.

Subsequently, on the second surface 15b side of the semiconductor layer 15, the surface of the insulating film 25 is ground to expose the p-side metal pillar 23 and the n-side metal pillar 24. The exposed surface of the p-side metal pillar 23 is the p-side external terminal 23a, and the exposed surface of the n-side metal pillar 24 is the n-side external terminal 24a.

Figure 15A:
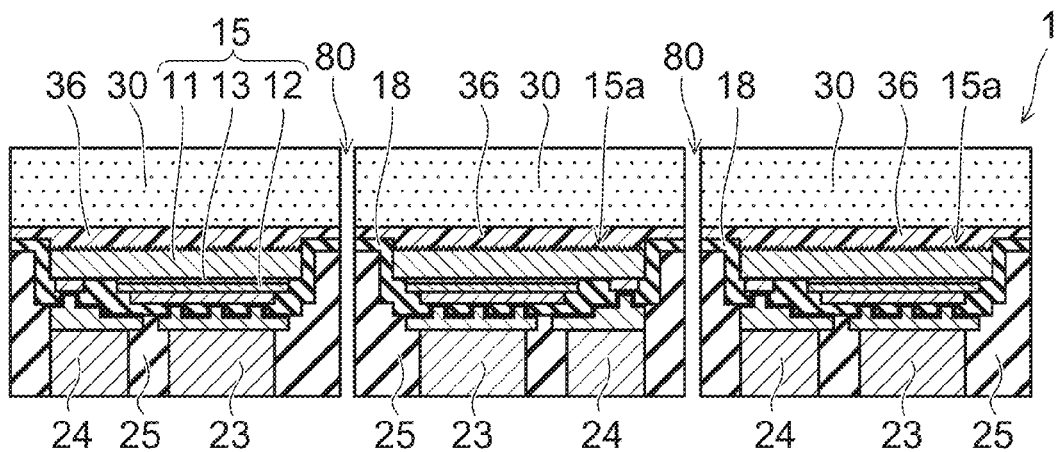
Figure 15B:
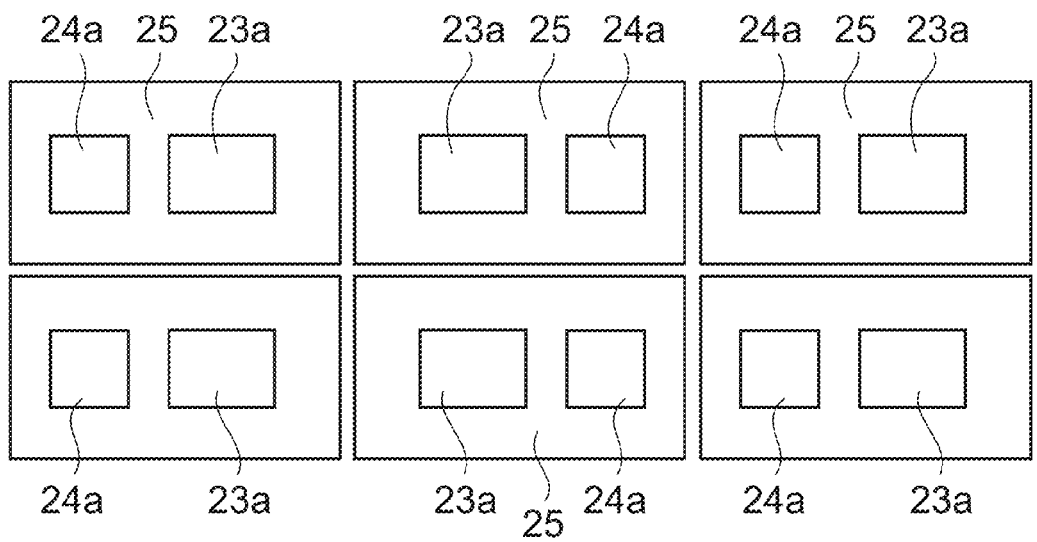

Next, as shown in FIG. 15A and FIG. 15B, the fluorescent body layer 30, the intermediate layer 36, the insulating film 18, and the insulating film 25 are cut between adjacent semiconductor layers 15. Thereby, the semiconductor light emitting device 1 including the semiconductor layer 15 is fragmented. FIG. 15A shows cross sections of semiconductor light emitting devices 1, and FIG. 15B shows the surface of the insulating film 25 from which the p-side external terminal 23a and the n-side external terminal 24a are exposed.

The cutting of the fluorescent body layer 30, the intermediate layer 36, the insulating film 18, and the insulating film 25 is performed using, for example, a dicing blade. The cutting may be performed also by laser irradiation.

The semiconductor layer 15 does not exist in the trench 80, and is therefore free from damage caused by dicing. On being fragmented, a structure in which the end (side surface) of the semiconductor layer 15 is covered and protected by the insulating film 18 is obtained.

The semiconductor light emitting device 1 may be a single-chip structure including one semiconductor layer 15, or may be a multi-chip structure including a plurality of semiconductor layers 15.

Since the processes before dicing are performed collectively in a wafer state, there is no need to perform wiring and packaging for each fragmented device, and a significant cost reduction is possible. That is, at the stage of being fragmented, wiring and packaging have already been performed. Therefore, the embodiment can enhance productivity and can reduce manufacturing costs.

Figure 16:
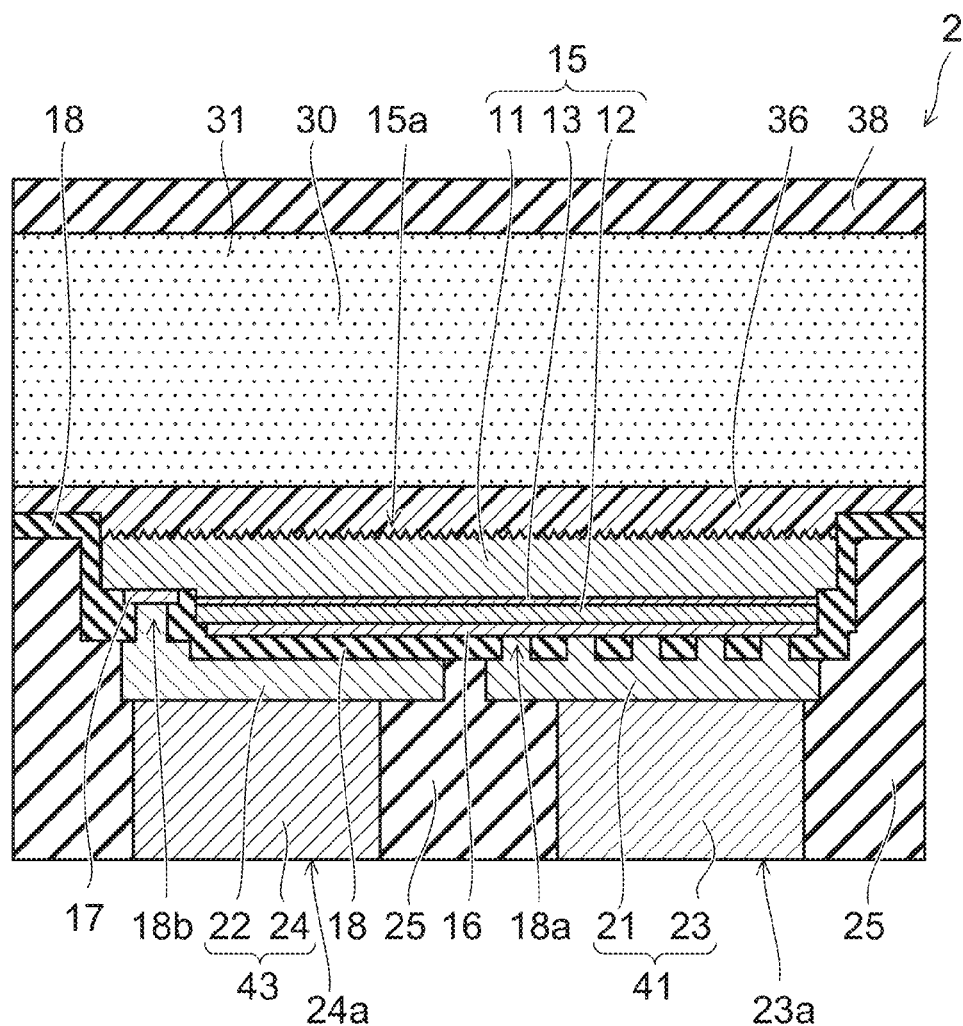
FIG. 16 is a schematic cross-sectional view showing a semiconductor light emitting device according to a first variation of the first embodiment.

FIG. 16 is a schematic cross-sectional view showing a semiconductor light emitting device 2 according to a first variation of the first embodiment. In the semiconductor light emitting device 2, a layer 38 that transmits the emission light of the light emitting layer 13 and the emission light of the fluorescent body 31 is provided on the fluorescent body layer 30. The layer 38 is, for example, an inorganic film such as a silicon oxide film and a silicon nitride film, and protects the fluorescent body layer 30. The layer 38 may be also a resin film of a silicone resin, an epoxy resin, or the like that transmits the emission light of the light emitting layer 13 and the emission light of the fluorescent body 31.

The layer 38 protects the fluorescent body layer 30. A material with a lower refractive index than the fluorescent body layer 30 may be used for the layer 38; thereby, the light extraction from the fluorescent body layer 30 can be improved.

Figure 17A:
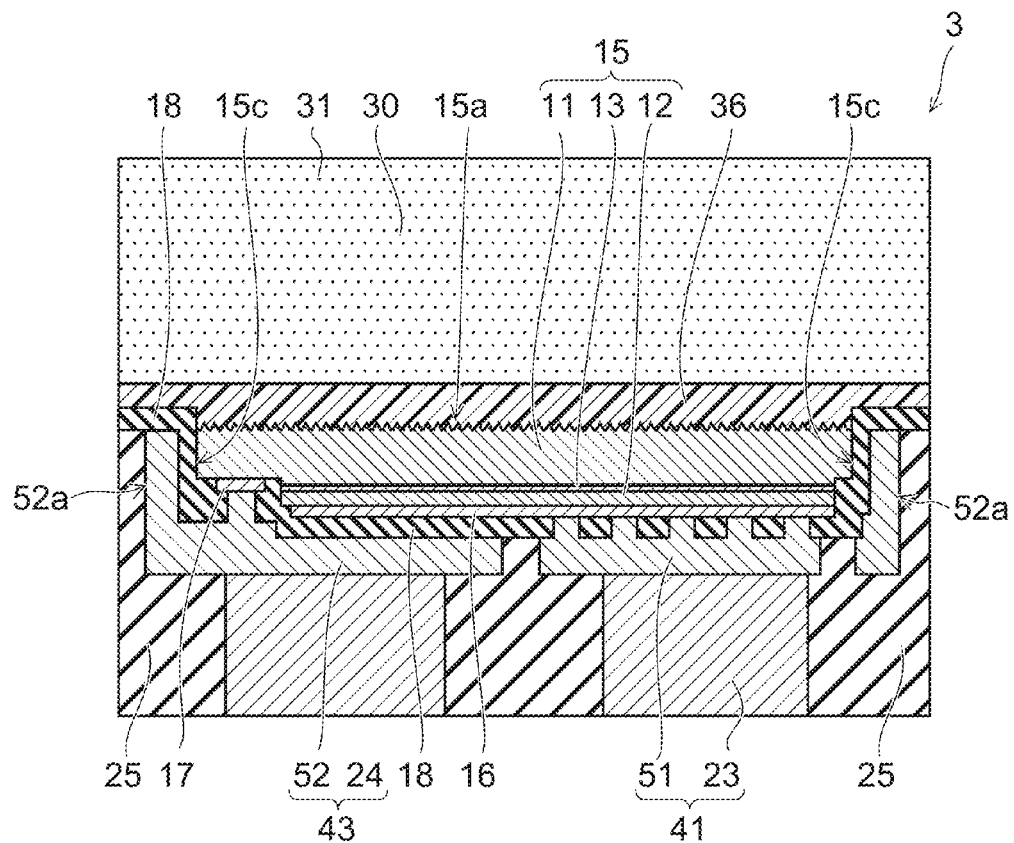
FIGS. 17A and 17B are schematic views showing a semiconductor light emitting device according to a second variation of the first embodiment.
Figure 17B:
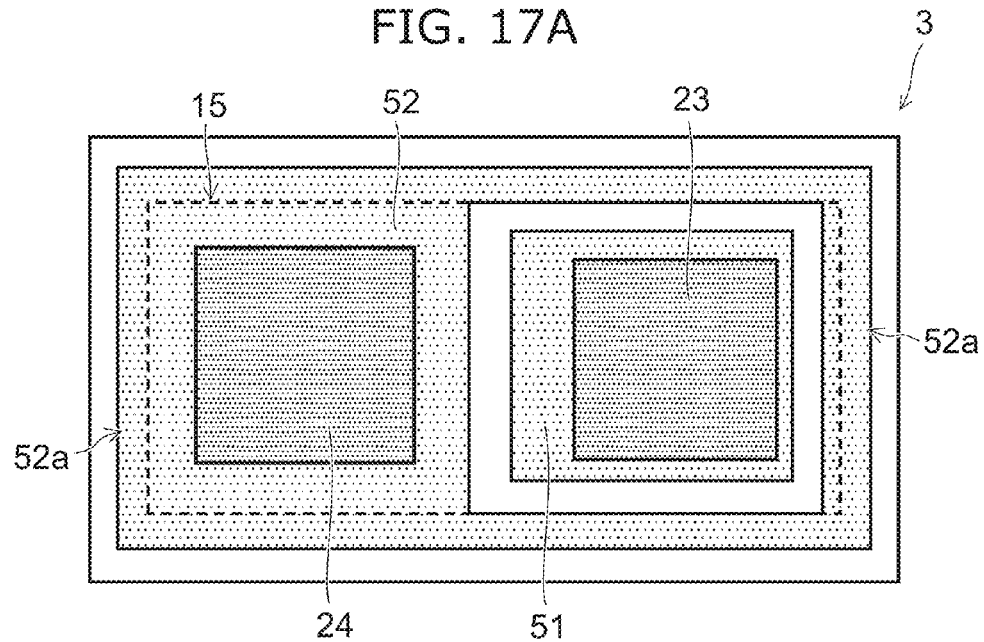

FIGS. 17A and 17B are schematic views showing a semiconductor light emitting device 3 according to a second variation of the first embodiment. FIG. 17A shows a cross section of the semiconductor light emitting device 3. FIG. 17B is a plan view showing the arrangement of a p-side interconnection layer 51 and an n-side interconnection layer 52 as viewed from the second surface 15b side.

As shown in FIG. 17A and FIG. 17B, in the semiconductor light emitting device 3, the n-side interconnection layer 52 extends across the outer edge of the semiconductor layer 15. The extending portion 52a of the n-side interconnection layer 52 surrounds the p-side interconnection layer 51, and covers the side surface 15c of the semiconductor layer 15. Thereby, the light emitted from the side surface 15c out of the light emitted from the light emitting layer 13 is blocked, and the light distribution characteristics of the semiconductor light emitting device 3 can be improved. That is, the excitation light not passing through the fluorescent body layer 30 but emitted from the side surface of the semiconductor light emitting device 3 can be suppressed, and color breakup etc. can be prevented.

Figure 18A:
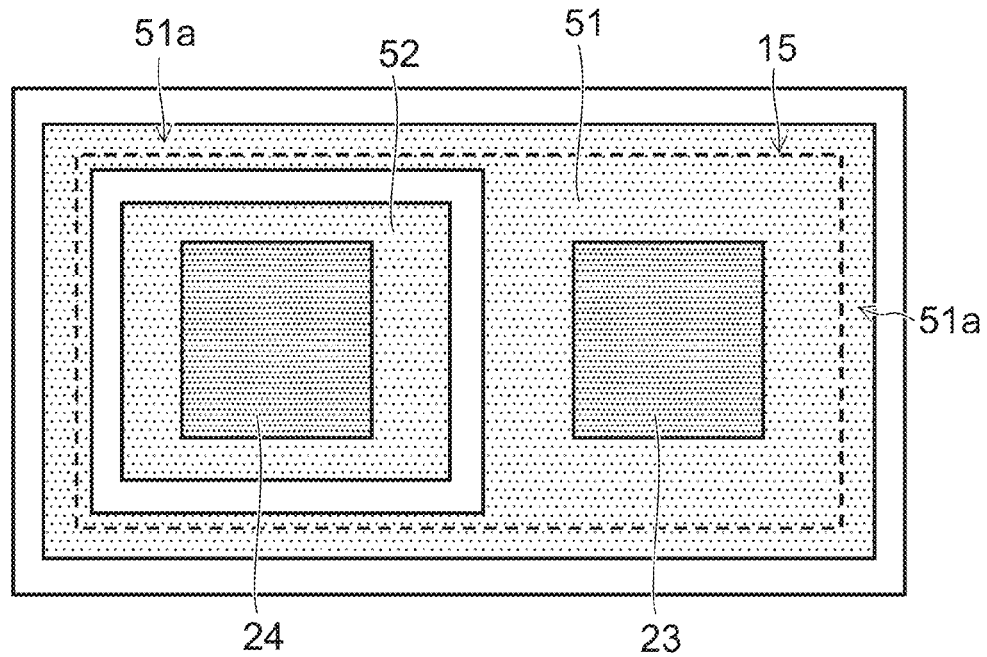
FIGS. 18A and 18B are plan views showing semiconductor light emitting devices according to a third variation of the first embodiment.
Figure 18B:
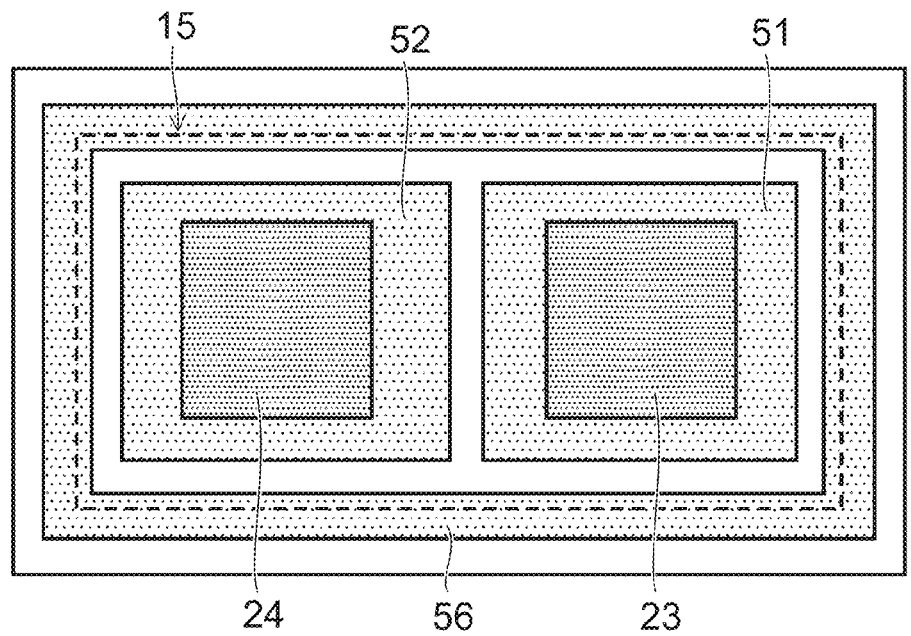

FIGS. 18A and 18B are plan views showing semiconductor light emitting devices according to a third variation of the first embodiment. FIG. 18A and FIG. 18B show arrangements of the p-side interconnection layer 51 and the n-side interconnection layer 52 as viewed from the second surface 15b side.

As shown in FIG. 18A, the p-side interconnection layer 51 may extend across the outer edge of the semiconductor layer 15. The extending portion 51a of the p-side interconnection layer 51 surrounds the n-side interconnection layer 52, and covers the side surface 15c of the semiconductor layer 15. Thereby, the light emitted from the side surface 15c out of the light emitted from the light emitting layer 13 is blocked.

As shown in FIG. 18B, it is also possible to provide a light blocking layer 56 that surrounds the p-side interconnection layer 51 and the n-side interconnection layer 52 and covers the side surface 15c of the semiconductor layer 15. The light blocking layer 56 is, for example, the same metal layer as the p-side interconnection layer 51 and the n-side interconnection layer 52, and is provided away from the p-side interconnection layer 51 and the n-side interconnection layer 52. The light blocking layer 56 blocks the light emitted from the side surface 15c out of the light emitted from the light emitting layer 13.

Thus, by using the structures shown in FIG. 18A and FIG. 18B, the excitation light not passing through the fluorescent body layer 30 but emitted from the side surface of the semiconductor light emitting device can be suppressed, and the light distribution characteristics can be improved.

Figure 19:
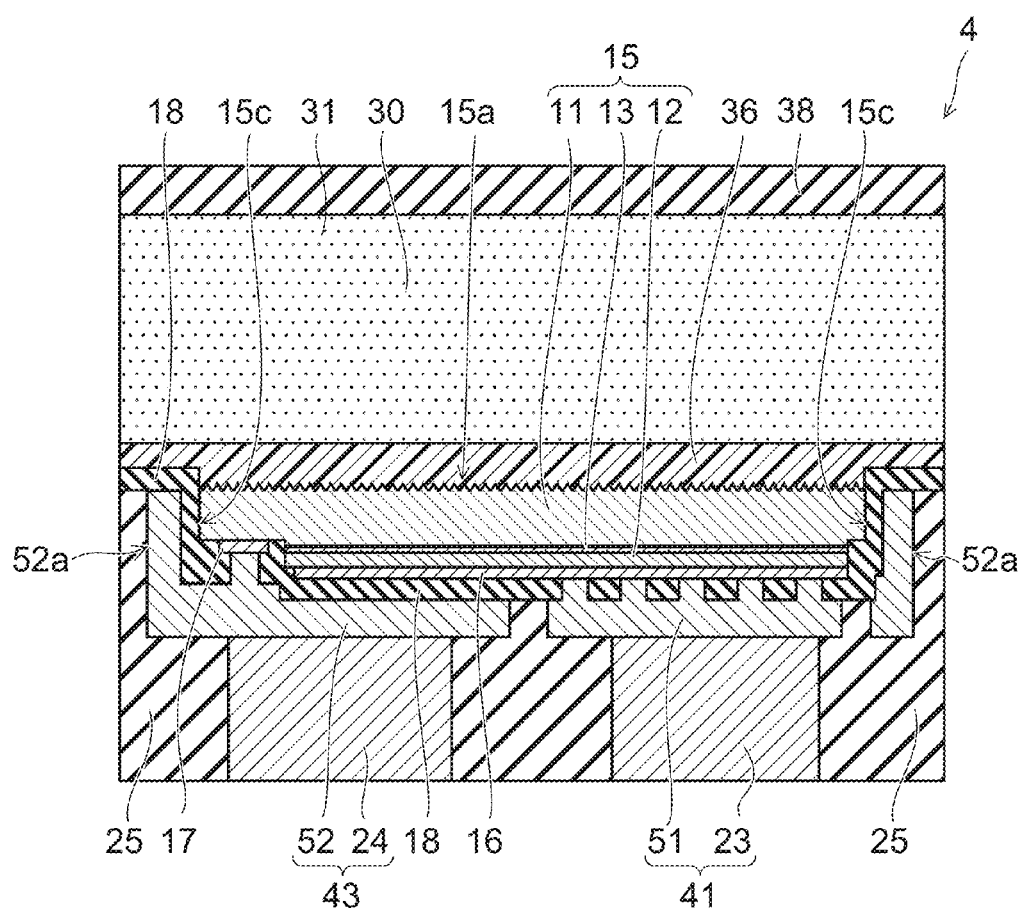
FIG. 19 is a schematic cross-sectional view showing a semiconductor light emitting device according to a fourth variation of the first embodiment.

FIG. 19 is a schematic cross-sectional view showing a semiconductor light emitting device 4 according to a fourth variation of the first embodiment. In the semiconductor light emitting device 4, the n-side interconnection layer 52 extends across the outer edge of the semiconductor layer 15. The extending portion 52a of the n-side interconnection layer surrounds the p-side interconnection layer 21, and covers the side surface 15c of the semiconductor layer 15. The layer 38 that transmits the emission light of the light emitting layer 13 and the emission light of the fluorescent body 31 is provided on the fluorescent body layer 30.

Thereby, the excitation light not passing through the fluorescent body layer 30 but emitted from the side surface of the semiconductor light emitting device can be suppressed, and color breakup etc. can be prevented. Furthermore, the layer 38 protects the fluorescent body layer 30. A material with a lower refractive index than the fluorescent body layer 30 may be used for the layer 38; thereby, the light extraction from the fluorescent body layer 30 can be improved.

As a still another variation of the embodiment, a structure is possible in which the p-side metal pillar 23 and the n-side metal pillar 24 are not provided and the p-side interconnection layer 21 and the n-side interconnection layer 22 are bonded individually to pads of the mounting substrate.

The p-side interconnection layer 21 and the p-side metal pillar 23 are not limited to being separate bodies, and the configuration may include the p-side interconnection unit 41 in which the p-side interconnection layer 21 and the p-side metal pillar 23 are integrally provided. Similarly, the n-side interconnection layer 22 and the n-side metal pillar 24 are not limited to being separate bodies, and the configuration may include the n-side interconnection unit 43 in which the n-side interconnection layer 22 and the n-side metal pillar 24 are integrally provided.

Second Embodiment

Figure 20A:
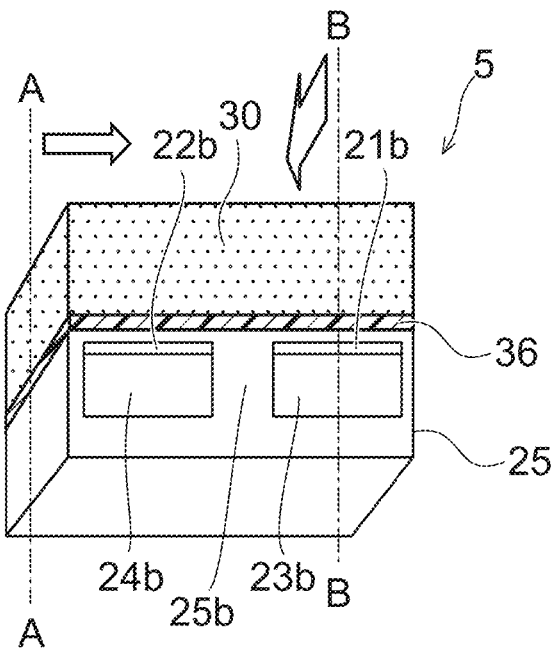
FIGS. 20A to 20C are schematic views showing a semiconductor light emitting device according to a second embodiment.
Figure 20B:
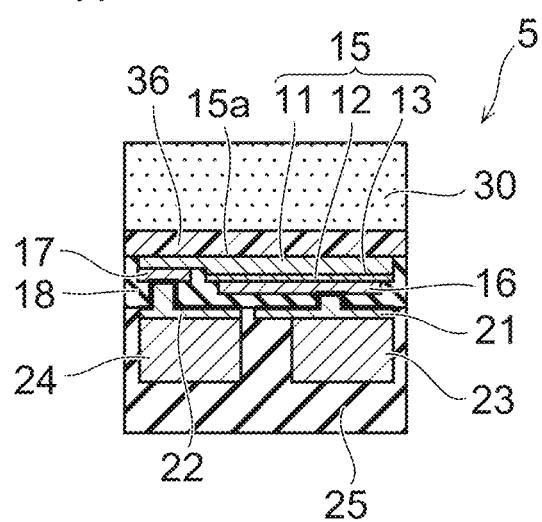
Figure 20C:
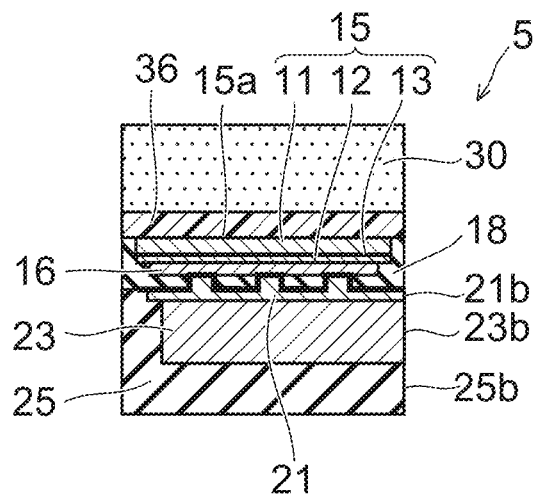
Figure 21:
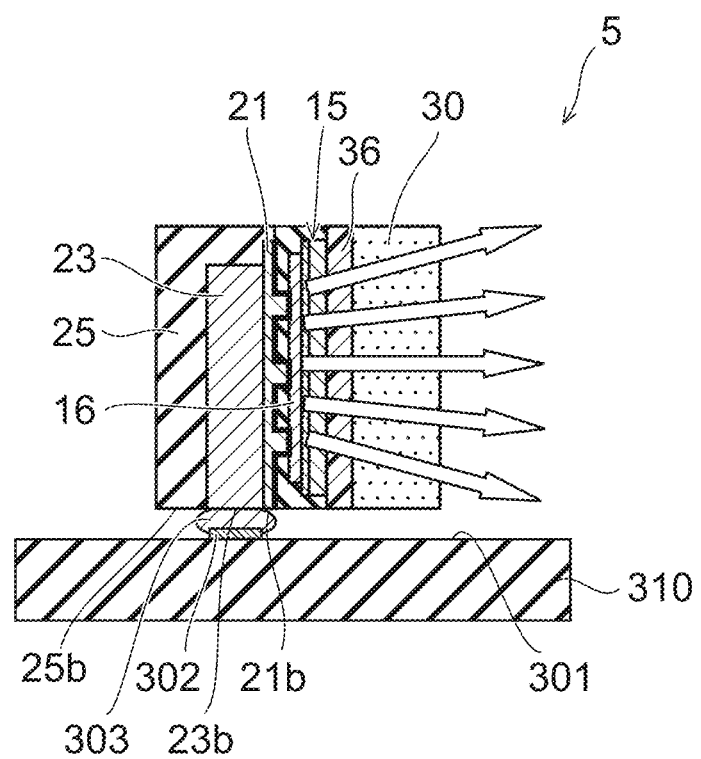
FIG. 21 is a schematic cross-sectional view showing a light emitting module in which the semiconductor light emitting device according to the second embodiment is mounted on a substrate.

FIGS. 20A to 20C are schematic views showing a semiconductor light emitting device 5 according to a second embodiment. FIG. 20A is a schematic perspective view of a semiconductor light emitting device 5. FIG. 20B is a cross-sectional view taken along line A-A in FIG. 20A. FIG. 20C is a cross-sectional view taken along line B-B in FIG. 20A. FIG. 21 is a schematic cross-sectional view of a light emitting module in which the semiconductor light emitting device 5 is mounted on a substrate 310.

As shown in FIG. 20A and FIG. 20C, part of the side surfaces of the p-side metal pillar 23 is exposed from the insulating film 25 at a third surface 25b that has a different plane direction from the first surface 15a and the second surface 15b of the semiconductor layer 15. The exposed surface functions as a p-side external terminal 23b for mounting on an external substrate.

The third surface 25b is, for example, a surface substantially perpendicular to the first surface 15a and the second surface 15b of the semiconductor layer 15. The insulating film 25 has, for example four rectangular side surfaces, and one of the side surfaces is the third surface 25b.

At the same third surface 25b, part of the side surfaces of the n-side metal pillar 24 is exposed from the insulating film 25. The exposed surface functions as an n-side external terminal 24b for mounting on the external substrate.

As shown in FIG. 20A, also part 21b of the side surfaces of the p-side interconnection layer 21 is exposed from the insulating film 25 at the third surface 25b, and functions as a p-side external terminal. Similarly, also part 22b of the side surfaces of the n-side interconnection layer 22 is exposed from the insulating film 25 at the third surface 25b, and functions as an n-side external terminal.

In the p-side metal pillar 23, the portion other than the p-side external terminal 23b exposed at the third surface 25b is covered with the insulating film 25. In the n-side metal pillar 24, the portion other than the n-side external terminal 24b exposed at the third surface 25b is covered with the insulating film 25.

In the p-side interconnection layer 21, the portion other than the side surface 21b exposed at the third surface 25b is covered with the insulating film 25. In the n-side interconnection layer 22, the portion other than the side surface 22b exposed at the third surface 25b is covered with the insulating film 25.

On the other hand, the intermediate layer 36 is provided between the first surface 15a and the fluorescent body layer 30. The intermediate layer 36 bonds the fluorescent body layer 30 and the semiconductor layer 15, for example. The fluorescent body layer 30 contains fluorescent bodies 31 and the bonding material 33. The fluorescent body layer 30 contains fluorescent bodies 31 in high concentration, and the average spacing between fluorescent bodies 31 in the fluorescent body layer 30 is narrower than the peak wavelength of the emission light of the light emitting layer 13. Thereby, the light distribution characteristics are improved.

As shown in FIG. 21, the semiconductor light emitting device 5 is mounted in a state where the third surface 25b is opposed to the mounting surface 301 of the substrate 310. The p-side external terminal 23b and the n-side external terminal 24b exposed at the third surface 25b are bonded individually to pads 302 provided on the mounting surface 301 via a solder 303. On the mounting surface 301 of the substrate 310, for example, an interconnection pattern connected to an external circuit is provided, and the pads 302 are connected to the interconnection pattern.

The third surface 25b is substantially perpendicular to the first surface 15a, which is a major light emitting surface. Therefore, in a state where the third surface 25b is opposed to the mounting surface 301 side, the first surface 15a faces in the lateral direction parallel to the mounting surface 301. That is, the semiconductor light emitting device 5 is what is called a side view-type semiconductor light emitting device, and emits light in the lateral direction parallel to the mounting surface 301.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor light emitting device comprising:
   a semiconductor layer having a first surface and a second surface on an opposite side to the first surface and including a light emitting layer;
   a p-side electrode provided on the semiconductor layer on a side of the second surface;
   an n-side electrode provided on the semiconductor layer on the side of the second surface;
   a fluorescent body layer provided on a side of the first surface and containing a plurality of fluorescent bodies configured to be excited by emission light of the light emitting layer and emit light of a different wavelength from the emission light, and a bonding material integrating the plurality of fluorescent bodies and configured to transmit the emission light, wherein an average spacing between adjacent ones of the plurality of fluorescent bodies is narrower than a peak wavelength of emission light of the light emitting layer; and
   an intermediate layer provided between the semiconductor layer and the fluorescent body layer, wherein the intermediate layer has a step on the side of the first surface such that the semiconductor layer is set back toward the p-side electrode and the n-side electrode.

2. The device according to claim 1, wherein the intermediate layer is configured to transmit the emission light of the light emitting layer.

3. The device according to claim 2, wherein in the intermediate layer, a thickness of a portion provided on a central portion of the semiconductor layer is thicker than a thickness of a portion provided along an outer periphery of the semiconductor layer.

4. The device according to claim 3, wherein the thickness of the portion provided along the outer periphery of the semiconductor layer is half or less of a spacing between an outer edge of the semiconductor layer and an outer edge of the fluorescent body layer.

5. The device according to claim 2, wherein the first surface is provided with unevenness and the intermediate layer covers the unevenness.

6. The device according to claim 2, wherein a refractive index of the bonding material is larger than a refractive index of the intermediate layer.

7. The device according to claim 6, wherein the bonding material contains a high refractive index particle.

8. The device according to claim 6, wherein the refractive index of the bonding material is larger than 1.5.

9. The device according to claim 2, wherein a refractive index of the fluorescent body layer is larger than a refractive index of the intermediate layer.

10. The device according to claim 1, further comprising a coating layer provided on the fluorescent body layer and configured to transmit the emission light of the light emitting layer and emission light of the plurality of fluorescent bodies.

11. The device according to claim 1, wherein the fluorescent body layer is provided on the first surface side of the semiconductor layer without a substrate on which the semiconductor layer is provided.

12. The device according to claim 1, further comprising:
   a first insulating film covering the second surface side of the semiconductor layer;
   a p-side interconnection unit provided on the first insulating film and electrically connected to the p-side electrode; and
   an n-side interconnection unit provided on the first insulating film and electrically connected to the n-side electrode.

13. The device according to claim 12, further comprising a second insulating film provided between the p-side interconnection unit and the n-side interconnection unit.

14. The device according to claim 12, wherein the p-side interconnection unit includes:
   a p-side interconnection layer connected to the p-side electrode; and
   a p-side metal pillar connected to the p-side interconnection layer and thicker than the p-side interconnection layer, and
   wherein the n-side interconnection unit includes:
   an n-side interconnection layer connected to the n-side electrode; and
   an n-side metal pillar connected to the n-side interconnection layer and thicker than the n-side interconnection layer.

15. The device according to claim 14, further comprising a second insulating film provided between the p-side interconnection unit and the n-side interconnection unit.

16. The device according to claim 12, wherein each of the p-side interconnection unit and the n-side interconnection unit includes an end portion which serves as a terminal connectable to an external circuit.

17. A semiconductor light emitting device comprising:
- a semiconductor layer having a first surface and a second surface on an opposite side to the first surface and including a light emitting layer;
- a p-side electrode provided on the semiconductor layer on a side of the second surface;
- an n-side electrode provided on the semiconductor layer on the side of the second surface;
- a sintered fluorescent body provided on a side of the first surface and containing a fluorescent body configured to be excited by emission light of the light emitting layer and emit light of a different wavelength from the emission light; and
- an intermediate layer provided between the semiconductor layer and the sintered fluorescent body and bonding the sintered fluorescent body to the semiconductor layer, wherein the intermediate layer has a step on the side of the first surface such that the semiconductor layer is set back toward the p-side electrode and the n-side electrode.

18. The device according to claim 17, wherein in the intermediate layer, a thickness of a portion provided on a central portion of the semiconductor layer is thicker than a thickness of a portion provided along an outer periphery of the semiconductor layer.

19. The device according to claim 18, wherein the thickness of the portion provided along the outer periphery of the semiconductor layer is half or less of a spacing between an outer edge of the semiconductor layer and an outer edge of the fluorescent body layer.

20. The device according to claim 17, wherein the first surface is provided with unevenness and the intermediate layer covers the unevenness.

* * * * *